United States Patent
Marr, Jr. et al.

(10) Patent No.: US 11,522,286 B2
(45) Date of Patent: Dec. 6, 2022

(54) SYSTEMS AND METHODS FOR DYNAMIC BIASING OF MICROWAVE AMPLIFIER

(71) Applicant: Epirus, Inc., Hawthorne, CA (US)

(72) Inventors: Harry Bourne Marr, Jr., Manhattan Beach, CA (US); Denpol Kultran, Torrance, CA (US); Ryan Scott Ligon, Los Angeles, CA (US); Steven Deward Gray, Jacksonville, FL (US)

(73) Assignee: Epirus, Inc., Hawthorne, CA (US)

( * ) Notice: Subject to any disclaimer, the term of this patent is extended or adjusted under 35 U.S.C. 154(b) by 0 days.

(21) Appl. No.: 17/561,033

(22) Filed: Dec. 23, 2021

(65) Prior Publication Data

US 2022/0115782 A1 Apr. 14, 2022

Related U.S. Application Data

(63) Continuation of application No. 17/235,875, filed on Apr. 20, 2021, now Pat. No. 11,211,703, which is a continuation-in-part of application No. PCT/US2020/021895, filed on Mar. 10, 2020, which is a continuation of application No. 16/779,036, filed on Jan. 31, 2020, and a continuation-in-part of application No. 16/779,036, filed on Jan. 31, 2020.

(60) Provisional application No. 63/145,410, filed on Feb. 3, 2021, provisional application No. 63/144,900, filed on Feb. 2, 2021, provisional application No. 62/817,096, filed on Mar. 12, 2019.

(51) Int. Cl.
*H01Q 3/28* (2006.01)
*G01S 7/03* (2006.01)
*H01Q 3/38* (2006.01)
*H03F 1/02* (2006.01)
*H03F 3/19* (2006.01)

(52) U.S. Cl.
CPC .............. *H01Q 3/28* (2013.01); *G01S 7/032* (2013.01); *H01Q 3/38* (2013.01); *H03F 1/0211* (2013.01); *H03F 3/19* (2013.01)

(58) Field of Classification Search
CPC .. H01Q 3/28; H01Q 3/38; G01S 7/032; H03F 1/0211; H03F 3/19
See application file for complete search history.

(56) References Cited

U.S. PATENT DOCUMENTS

| | | |
|---|---|---|
| 3,562,741 A | 2/1971 | McEvoy |
| 4,430,577 A | 2/1984 | Bouquet |
| 5,164,689 A | 11/1992 | Plonka |
| 5,426,641 A * | 6/1995 | Afrashteh .............. H03G 3/007 370/347 |
| 5,880,648 A | 3/1999 | Aves |
| 6,362,449 B1 | 3/2002 | Hadidi et al. |
| 7,242,518 B1 | 7/2007 | Lynch |

(Continued)

OTHER PUBLICATIONS

Ampleon AN11226 TTL Bias Switching Application Note, Revision 2 (2015).

(Continued)

*Primary Examiner* — Hafizur Rahman
(74) *Attorney, Agent, or Firm* — Knobbe Martens Olson & Bear LLP

(57) ABSTRACT

A system for adjusting bias power provided to a radio-frequency amplifier to increase plurality of figures of merit based on sensed characteristics of the amplifier and/or characteristics of the input or output power.

20 Claims, 21 Drawing Sheets

(56) References Cited

U.S. PATENT DOCUMENTS

| | | |
|---|---|---|
| 7,256,650 B1 | 8/2007 | Stockert |
| 7,388,433 B1 | 6/2008 | Hecht |
| 7,479,691 B2 | 1/2009 | Ewe et al. |
| 7,508,338 B2 | 3/2009 | Pluymers |
| 7,948,318 B2 | 5/2011 | Hongo |
| 8,712,344 B2 | 4/2014 | Wang |
| 8,718,580 B2 | 5/2014 | Borodulin |
| 8,737,527 B2 | 5/2014 | Lozhkin |
| 8,737,531 B2 | 5/2014 | Saunders |
| 8,760,634 B2 | 6/2014 | Rose |
| 9,065,163 B1 | 6/2015 | Wu |
| 9,111,949 B2 | 8/2015 | Yu et al. |
| 9,518,554 B2 | 12/2016 | Mongin |
| 9,548,880 B2 | 1/2017 | Hori |
| 9,825,593 B2 | 11/2017 | de Vreede |
| 9,984,996 B2 | 5/2018 | Lu et al. |
| 10,224,184 B2 | 3/2019 | Van Zyl |
| 10,304,669 B1 | 5/2019 | Coumou |
| 10,705,556 B2 | 7/2020 | Kapur |
| 10,938,347 B2 | 3/2021 | Rofougaran |
| 10,958,323 B1 | 3/2021 | Benyishay |
| 11,005,514 B2 | 5/2021 | Cordier |
| 11,012,120 B2 | 5/2021 | Guillot |
| 11,094,507 B2 | 8/2021 | Funk |
| 11,158,942 B1 | 10/2021 | Scott |
| 11,211,703 B2 | 12/2021 | Marr |
| 2003/0227330 A1 | 12/2003 | Khanifar |
| 2006/0049870 A1 | 3/2006 | Hellberg |
| 2008/0153435 A1 | 6/2008 | Hirano |
| 2008/0297414 A1 | 12/2008 | Krishnaswamy |
| 2010/0237884 A1 | 9/2010 | Bult |
| 2011/0054271 A1 | 3/2011 | Derchak |
| 2012/0200281 A1 | 8/2012 | HerbSommer et al. |
| 2013/0120190 A1 | 5/2013 | McCune |
| 2014/0266460 A1 | 9/2014 | Nobbe |
| 2015/0061769 A1 | 3/2015 | Bodnar |
| 2015/0270806 A1 | 9/2015 | Wagh |
| 2016/0036113 A1 | 2/2016 | Wu et al. |
| 2016/0049909 A1 | 2/2016 | Scherrer |
| 2016/0127060 A1 | 5/2016 | Cross |
| 2016/0282450 A1 | 9/2016 | Kishigami |
| 2017/0180011 A1 | 6/2017 | Charvat |
| 2017/0359033 A1 | 12/2017 | Bazzani |
| 2018/0131102 A1 | 5/2018 | Wang |
| 2019/0058448 A1 | 2/2019 | Seebacher |
| 2020/0036334 A1 | 1/2020 | Witt |
| 2020/0395894 A1 | 12/2020 | Esmael |
| 2021/0057813 A1 | 2/2021 | So |
| 2021/0399695 A1 | 12/2021 | Kultran |
| 2022/0045423 A1 | 2/2022 | Scott |
| 2022/0115782 A1 | 4/2022 | Marr |
| 2022/0158346 A1 | 5/2022 | Marr |

OTHER PUBLICATIONS

Barsegyan, et al., Bias Sequencing and Gate Pulsing Circuit for GaN Amplifier (2015).

Delos, et al., Rarely Asked Questions—Issue 148 Unique Gate Drive Applications Enable Rapidly Switching On/Off for Your High Power Amplifier, Analog Dialog 51-12 (2017).

Gold, et al., Review of high-power microwave source resource, Review of Scientific Instruments 68:3945 (1997).

Korovin, et al., Pulsed Power-Driven High-Power Microwave Sources, Proceedings of the IEEE 92(7):1082-1095 (2004).

Manh, et al., An Independently Biased 3-stack GaN HEMT Configuration for 5G Mobile Networks (2019).

Pajic, et al., X-Band Two-Stage High-Efficiency Switched-Mode Power Amplifiers, IEEE Transactions on Microwave Theory and Techniques, 53(9):2899-2907 (2005).

Schafer, et al., X-Band MMIC GaN Power Amplifiers Designed for High-Efficiency Supply-Modulated Transmitters (2013).

Sheppard, et al., High-Power Microwave GaN/Al GaN HEMT's on Semi-Insulating Silicon Carbide Substrates, IEEE Electron Device Letters, 20(4):161-163 (1999).

Wang, et al., 60% Efficient 10-GHz Power Amplifier with Dynamic Drain Bias Control, IEEE Transactions on Microwave Theory and Techniques, 52(3):1077-1081 (2004).

* cited by examiner a) Gate Switching

SYSTEMS AND METHODS FOR DYNAMIC BIASING OF MICROWAVE AMPLIFIER

CROSS-REFERENCE TO RELATED APPLICATIONS

This application is a continuation of U.S. application Ser. No. 17/235,875 filed Apr. 20, 2021, which is a continuation-in-part of U.S. application Ser. No. 16/779,036 filed Jan. 31, 2020, which claims benefit of priority of U.S. Provisional Patent Application No. 62/817,096, filed Mar. 12, 2019, the entire contents of each of the above-identified application are incorporated herein by reference. This application is a continuation-in-part of International Patent Application No. PCT/US2020/021895 filed Mar. 10, 2020, which claims benefit of priority of U.S. Provisional Patent Application No. 62/817,096, filed Mar. 12, 2019, and is a continuation of U.S. application Ser. No. 16/779,036 filed Jan. 31, 2020, the entire contents of each of the above-identified application are incorporated herein by reference.

This application claims benefit of priority of U.S. Provisional Patent Application No. 63/144,900, filed Feb. 2, 2021 and of U.S. Provisional Patent Application No. 63/145,410, filed Feb. 3, 2021, the entire contents of each of the above-identified application are incorporated herein by reference.

TECHNICAL FIELD

This disclosure relates generally to radio frequency (RF) amplifiers; specifically, using circuits and methods to improve the power efficiency and linearity and power out performance of the amplifier devices. These inventions relate to the field of commercial technology for using RF for terrestrial and satellite based communications and radar, but also to other fields such as radio astronomy, RF sensing for autonomous vehicles, high-power electromagnetic signal processing as well as electronic counter measures and other areas where RF amplifiers are used. Some implementations of the disclosure are directed toward techniques for synchronizing power circuits with coherent radio frequency (RF) signals to form a steered composite RF signal in a far field.

BACKGROUND

Amplifiers to increase the magnitude of voltage/current/power of an input signal are useful in many analog and digital devices including radio frequency (RF) devices, microwave devices, computers/laptops and cell phones. Output power, efficiency and linearity are some of the important figures-of-merit (FoM) for systems employing amplifiers. Existing driving schemes for many amplifiers (e.g., high power amplifiers) are not designed to optimize multiple figures of merit. Accordingly, driving schemes that can improve various figures-of-merit for amplifiers are advantageous.

Furthermore, the production of high-power RF signals, such as multiple watts for commercial applications and up to Megawatts of radiated power for other applications, typically requires RF amplifiers and other signal processing circuitry that consume large amounts of energy, which may result in large amounts of radiated heat. Consequently, expensively rated circuits and elaborate cooling mechanisms are typically required in such systems. Moreover, the bias voltages/currents required for efficient operation of RF amplifiers in high-power generating RF systems can change with age and/or temperature. Accordingly, there is a need for circuits that can change provide appropriate bias voltages/currents to achieve efficient performance of RF amplifiers in high-power generating RF systems.

SUMMARY

Various implementations described herein are directed towards methods and systems to provide bias current and power that would set or change the operating conditions of a radio frequency amplifier, such as, for example, high power Gallium Nitride (GaN), silicon metal oxide semiconductor field effect transistors (MOSFETS), other III-V devices, or other semiconductor-based radio frequency (RF) amplifiers. Various implementations of biasing systems described herein are configured to provide biasing voltages/currents to turn on/off the amplifiers and/or dynamically adjust the biasing voltages/currents to change the operating conditions of the amplifier. For example, the implementations of biasing systems described herein are configured to dynamically change the operating condition of an amplifier from operating in a saturation regime to operating in a linear regime or vice-versa. The biasing system allows to dynamically adjust between any class of amplifier, including but not limited to class A, class AB, class B, class C, class D, class E, class F, class G, class H, Class S and class T. These classes of amplifiers have to do with what cycle of an RF waveform, such as a sinusoid, draw current. In a class A amplifier, the current is drawn throughout the entire waveform cycle, and is the most linear, such that intermodulation distortion products are the lowest and the amplifier has the highest signal dynamic range. Using the dynamic biasing approach, the amplifier can be switched to different classes of linear amplifier and make a tradeoff between power efficiency and linearity, where the larger of the current cycle the system allows the amplifier to draw, the more linear it is but less efficient. The less of the cycle the amplifier is allowed to draw current, the less linear but the more power efficient the amplifier becomes. Most RF amplifiers can transmit more RF power in less linear modes. According, linearity is often traded with output power. The biasing system is also used to completely turn the amplifier off when no RF signals are flowing through the amplifier and being amplified. Turning off the bias completely minimizes leakage and quiescent current. Turning off quiescent current is critical for especially high power amplifiers with high drain voltages such as 22 volts or 65 volts, because with large drain voltages, the quiescent current is significant. The amplifiers driven by the biasing systems described herein can be configured to produce high-power RF signals with low average power, such as, for example average power less than or equal to about 5 Kilowatts. The biasing system can be embodied as field programmable gate arrays (FPGAs), application specific integrated circuit (ASICs), analog circuits, and/or monolithic multiwave integrated circuits (MMICs).

Implementations of biasing systems and methods described herein are configured to adjust the biasing currents/voltages of the amplifier based on information obtained about the input signal characteristics, output signal characteristics, system operating conditions (e.g., operating temperature, operating currents/voltages at various terminals of the amplifier/system, etc.), an input received from a user or an electronic processing system controlling the biasing systems and/or by information obtained from look-up tables that provide an understanding of the state of the amplifier system. The biasing voltages/currents can be adjusted in real time or substantially in real time (e.g., within about 1 ns and about 50 ns or more) after receiving an input or obtaining information regarding the input signal characteristics, output signal characteristics and/or system operating conditions. For example, various implementations of the biasing systems can be configured to sense/obtain input signal characteristics, output signal characteristics, system operating conditions (e.g., operating temperature, operating currents/voltages at various terminals of the amplifier/system, etc.) and/or information from one or more look-up tables and adjust the biasing currents/voltages provided to the amplifier in real time or substantially in real time to optimize one or more of the following figures of merit: amplifier gain, output power, drain/power efficiency, linearity, and signal-to-noise ratio. For example, various implementations of the biasing systems can be configured to sense/obtain input signal characteristics, output signal characteristics, system operating conditions (e.g., operating temperature, operating currents/voltages at various terminals of the amplifier/system, etc.) and/or information from one or more look-up tables and adjust the biasing current/voltages provided to the amplifier in real time or substantially in real time to increase drain/power efficiency and linearity for a target output power. As another example, various implementations of the biasing systems can be configured to sense/obtain input signal characteristics, output signal characteristics, system operating conditions (e.g., operating temperature, operating currents/voltages at various terminals of the amplifier/system, etc.) and/or information from one or more look-up tables and adjust the biasing current/voltages provided to the amplifier in real time or substantially in real time to increase linearity for a target drain/power efficiency. As yet another example, various implementations of the biasing systems are configured to turn on/turn off the biasing current/voltage provided to the amplifier based on whether or not a signal to be amplified is input to the amplifier. As another example, various implementations of the biasing systems are configured to adjust and/or turn off the biasing current/voltage provided to the amplifier to reduce damaging the amplifier.

Implementations of the biasing systems described herein are configured to drive amplifiers that are disposed in a phased array system. The phased array system can comprise antennas that receive amplified RF signal output by the amplifiers. The phased array system can employ digital beam-forming capability and controlled by software instructions. The phased array system can be configured as an electromagnetic pulse (EMP) generation system, a radar system, a jamming system, a communications system and/or an electronic counter measures system. For example, the phased array system can be configured to generate EMPs with Megawatts of radiated power. In the phased array implementation, each power amplifier at each element in the phased array may need a unique bias set point to optimize power out, optimize the linearity, efficiency of the amplifier or other characteristics. This is due to the fact that the local temperature or voltage or process setting for each amplifier is often unique. Different locations in the phased array will have different temperatures, so that in optimizing the dynamic bias voltage for temperature, each amplifier will need a different bias so tuning each element in the phased array to its own unique bias becomes important for optimization over the whole array. Especially with high band gap devices such as GaAs, InP, SiGe, and GaN amplifiers, the dopants to create the semiconductor vary largely from transistor to transistor in the manufacturing process known as process variation. Process variation is another factor that requires each amplifier to require its own unique bias to optimize the array. In different areas of the array, the voltage to the devices will also vary. Different locations in the array will have differing voltage ripple. Different locations will also have different loads and different impedances such as if the phased array is built out of columns where each column is sourced with a single power supply, the lowest element in the column will see a different supply voltage than the highest element in the column due to resistance along the column. Voltage variation is another example where dynamic biasing on a per element basis is required to optimize over the whole array. Phased arrays also suffer unique voltage standing wave ratio (VSWR) at each element in the array because the inner most elements will see a very different electromagnetic interference pattern than the outermost elements, causing different VSWR. VSWR is also corrected through dynamic biasing.

In some implementations, an apparatus has a processor and a memory connected to the processor. The memory stores instructions executed by the processor to sequentially collect from an array of amplifiers individual amplifier current values. The array of amplifiers is an array of high-power amplifiers configured as a phased array. The individual amplifier current values are compared to target amplifier current values to periodically identify an amplifier state error. Alteration of an amplifier gate bias voltage is initiated in response to the amplifier state error.

Various implementations can include an apparatus comprising an RF signal generator to produce RF signals phase shifted relative to one another in accordance with RF frequency waveform parameters; and amplifier chains to process the RF signals to produce channels of amplified RF signals, wherein each amplifier chain has amplifiers and wherein at least one amplifier has a tunable gate voltage synchronized with the RF signals.

In some implementations, the amplifier chains can have a plurality of solid state amplifiers each of which has a tunable gate voltage. The tunable gate voltage can be an amplifier on set point that is derived from an automatic calibration operation. In various implementations, the amplifier can have a capacitance that is tuned to an on set point for the at least one amplifier. In various implementations, the amplifier can have a gate voltage tuned based on sensor feedback from the at least one amplifier. In various implementations, an offset voltage of a plurality of gate voltage slave circuits is tuned and controlled by a central master power gating circuit. Various implementations of the apparatus described herein can further comprise a central computer to produce the Radio Frequency (RF) waveform parameters. Various implementations of the apparatus described herein can further comprise an antenna array to broadcast the channels of amplified RF signals as a steered composite RF signal with Megawatts of radiated power. The steered composite RF signal can be pulsed for less than 1 millisecond. The steered composite RF signal can have a frequency of approximately 1 GHz.

The central computer can include a processor and a memory storing a target classifier with instructions executed by the processor to classify a target based upon flight attributes of the target. The central computer can include a waveform selector stored in the memory, the waveform selector being configured to select the RF waveform parameters from a waveform look-up table. The RF signal generator can be an RF system on a Chip Field Programmable Gate Array. The RF signal generator can produce digital RF signals that are applied to digital-to-analog converters. Various implementations of the apparatus can further comprise a power sequencer controlled by the RF signal generator.

The power sequencer can be configured as a master power sequencing gating unit. Various implementations of the apparatus can further comprise smart slave circuits controlled by the power sequencer, wherein the smart slave circuits coordinate an automatic calibration operation. Various implementations of the apparatus can further comprise a reflector dish to process the channels of amplified RF signals. Various implementations of the apparatus can further comprise a mechanical gimbal to orient the position of the reflector dish. Various implementations of the apparatus can be in combination with a target detector.

The systems, methods, modules, and devices of this disclosure each have several innovative aspects, no single one of which is solely responsible for the desirable attributes disclosed herein. A variety of example systems, modules, and methods are provided below.

Embodiment 1: An amplifying system comprising:
  a radio-frequency (RF) amplifier, the RF amplifier configured to receive an incoming RF signal having an input power through an input port and an outgoing RF signal through an output port, the outgoing RF signal having an output power; and
  a power management system configured to adjust the RF amplifier by controlling an amount of bias power provided to the RF amplifier,
  wherein the power management system is configured to sense at least one of the input power of the incoming RF signal, the output power of the outgoing RF signal, or a characteristic of the RF amplifier and adjust the amount of bias power provided to the RF amplifier based on the sensed input power of the incoming RF signal, the output power of the outgoing RF signal, or a characteristic of the RF amplifier to improve a figure of merit of the RF amplifier.

Embodiment 2: The amplifying system of Embodiment 1, wherein the figure of merit is linearity of the RF amplifier, and wherein power management system is configured to improve linearity of the RF amplifier by adjusting the amount of bias power to the RF amplifier to reduce an amount of third order intermodulation distortions (IMD3).

Embodiment 3: The amplifying system of any of Embodiments 1-2, wherein the power management system is configured to adjust the amount of bias power provided to the RF amplifier to reduce third order intermodulation distortions (IMD3) by an amount less than or equal to about 150 dB.

Embodiment 4: The amplifying system of any of Embodiments 1-4, wherein the RF amplifier comprises a field effect transistor (FET) amplifier comprising a gate terminal, a drain terminal and a source terminal, and
  wherein the power management system is configured to adjust the bias power provided to the RF amplifier by adjusting a gate bias voltage between the gate terminal or the source terminal or adjusting a drain bias voltage between the drain terminal and the source terminal.

Embodiment 5: The amplifying system of Embodiment 4, wherein for a given output power, the power management system is configured to provide an amount of gate bias voltage that reduces third order intermodulation distortions (IMD3) to improve linearity.

Embodiment 6: The amplifying system of Embodiment 5, wherein the third order intermodulation distortions (IMD3) is reduced by an amount less than or equal to about 150 dB.

Embodiment 7: The amplifying system of any of Embodiments 4-6, wherein a drain efficiency obtained at the amount of gate bias voltage that reduces third order intermodulation distortions (IMD3) is lower than a maximum drain efficiency for the given output power.

Embodiment 8: The amplifying system of any of Embodiments 4-7, wherein the characteristic of the RF amplifier comprises at least one of temperature, drain voltage, gate voltage, drain current, or gate current of the FET amplifier.

Embodiment 9: A phased array system comprising:
  a plurality of amplifying systems of any of Embodiments 1-8 arranged in a first array; and
  a plurality of antennas arranged in a second array, each of the plurality of antennas arranged in the second array being coupled to the output port of a corresponding one of the amplifying system in the first array.

Embodiment 10: The phased array system of Embodiment 9, configured as a radar system, a communications system, or an electronic counter measures system.

Embodiment 11: An amplifying module comprising:
  a radio-frequency (RF) amplifier configured to receive an incoming RF signal having an input power through an input port and output an outgoing RF signal through an output port, the outgoing RF signal having an output power, the RF amplifier configured to be operated in a saturation mode in which the output power is approximately equal to saturation power of the RF amplifier and a non-saturation mode in which the output power is less than the saturation power of the RF amplifier; and
  a power management system configured to transition the RF amplifier between the saturation mode and the non-saturation mode by adjusting an amount of bias power provided to the RF amplifier.

Embodiment 12: The amplifying module of Embodiment 11, wherein the power management system can be configured to transition operating mode of RF the amplifier from the saturation mode and the non-saturation mode smoothly along a power transfer curve of the RF amplifier.

Embodiment 13: The amplifying module of any of Embodiments 11-12, wherein the power management system is configured to change operating mode of the RF amplifier in real-time.

Embodiment 14: The amplifying module of any of Embodiments 11-13, wherein the power management system is configured to change the operating mode of the RF amplifier based on an input received from a user, a computing device controlling the power management system, or a sensor sensing the input power of the incoming RF signal.

Embodiment 15: The amplifying module of any of Embodiments 11-14, wherein the RF amplifier comprises a field effect transistor (FET) amplifier comprising a gate terminal, a drain terminal and a source terminal, and
  wherein the power management system is configured to transition the amplifier between the saturation mode and the non-saturation mode by adjusting an amount of gate bias voltage between the gate terminal and the source terminal.

Embodiment 16: An amplifying module comprising:
  a radio-frequency (RF) amplifier configured to receive an incoming RF signal having an input power through an input port and output an outgoing RF signal through an output port, the outgoing RF signal having an output power; and
  a power management system configured to change a class of operation of the RF amplifier by controlling an amount of bias power provided to the RF amplifier.

Embodiment 17: The amplifying module of Embodiment 16, wherein the power management system is configured to change the class of operation of the RF amplifier in real-time.

Embodiment 18: The amplifying module of any of Embodiments 16-17, wherein the power management system is configured to change the class of operation of the RF amplifier based on an input received from a user, a computing device controlling the power management system, or a sensor sensing the input power of the incoming RF signal.

Embodiment 19: The amplifying module of any of Embodiments 16-18, wherein the RF amplifier comprises a field effect transistor (FET) amplifier comprising a gate terminal, a drain terminal and a source terminal, and
   wherein the power management system is configured to change the class of operation of the RF amplifier by controlling an amount of gate bias voltage between the gate terminal and the source terminal.

Embodiment 20: The amplifying module of any of Embodiments 16-19, wherein the class of the RF amplifier is selected from a group consisting of class A, class B, class AB, class C, class D, class E, Class F, class G, class H, and Class T.

BRIEF DESCRIPTION OF THE FIGURES

The disclosure is more fully appreciated in connection with the following detailed description taken in conjunction with the accompanying drawings, in which.

Like reference numerals refer to corresponding parts throughout the several views of the drawings.

DETAILED DESCRIPTION

Figure 1:
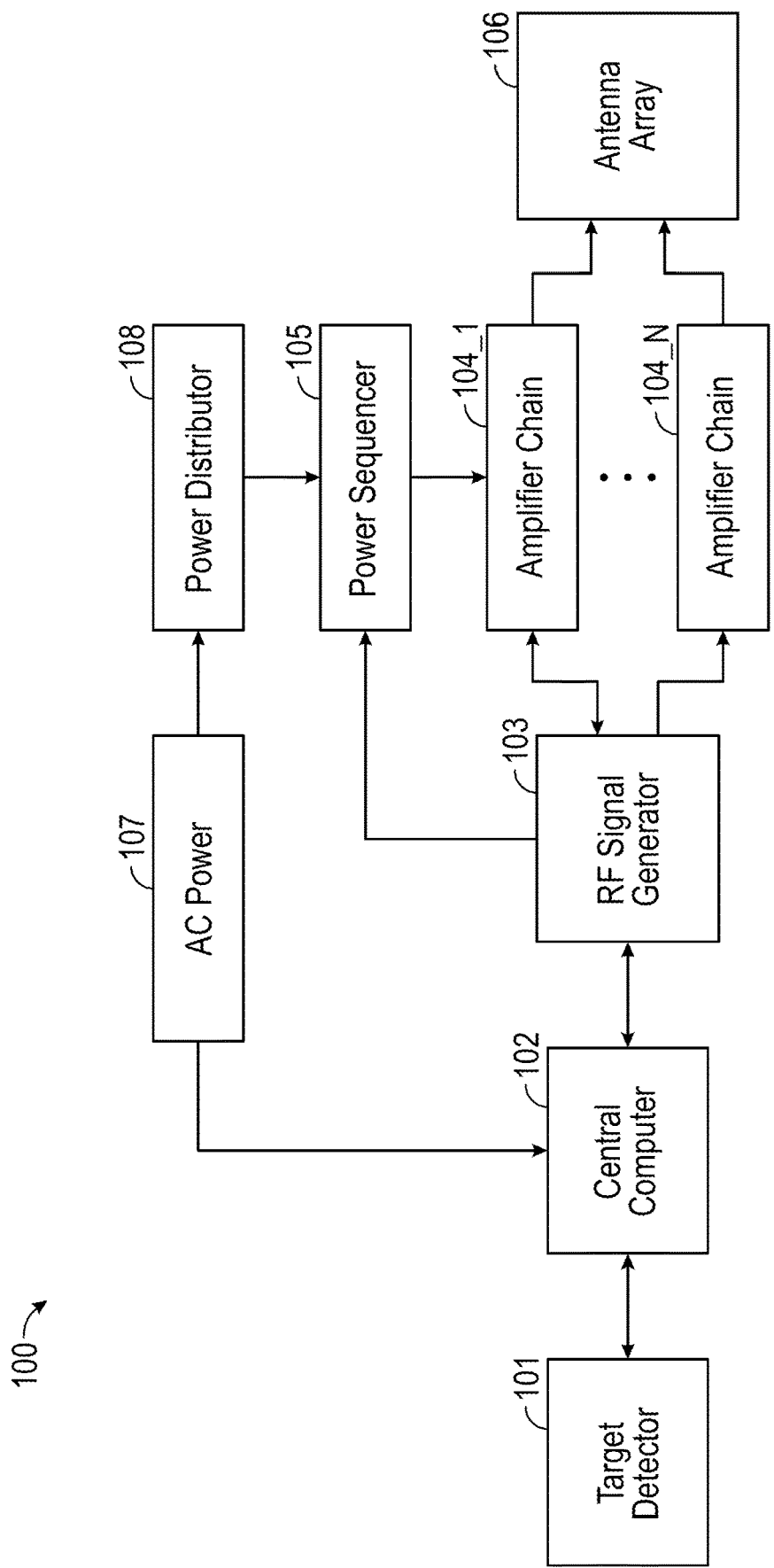
FIG. 1 illustrates an RF signal generating apparatus.

FIG. 1 illustrates an RF signal generating apparatus 100. The RF signal may be generated in response to a user command entered at a keyboard. In one embodiment, the RF signal is generated in response to the identification of a target by a target detector 101, such as a camera utilizing computer vision algorithms. Consider the case of an unmanned aerial vehicle or drone, the target detector 101 collects a signature characterizing the flight attributes of the drone. The target detector 101 also collects free space parameters associated with the drone, such as azimuth angle, elevation and range. Embodiments described collect this information when the target is 500 to 300 meters from the target detector 101. The signature and free space parameters are passed from the target detector to a central computer 102.

The central computer 102 classifies the target and selects RF waveform parameters, which are passed to an RF signal generator 103. In various implementations, the RF signal generator 103 can be programmable and controlled by the computer 102 to change various parameters of the generated RF signal including but not limited to frequency and power of the RF signal. The RF signal generator 103 creates RF signals in accordance with the RF waveform parameters. Each RF signal has a waveform of the frequency, pulse width, pulse repetition interval and intra-pulse modulation specified by the RF waveform parameters received from the central computer 102. The frequency, pulse width, pulse repetition interval and intra-pulse modulation of the generated RF signal can be changed by the computer 102 in real time or sufficiently real time.

The RF signal generator 103 produces RF signals for multiple channels that are applied to amplifier chains 104_1 through 104_N. The RF signals for the multiple channels are phase shifted relative to one another in accordance with RF frequency waveform parameters. In one embodiment, the phase shifting is digitally performed within the RF signal generator 103. Alternately, analog phase shifters may shift the RF signals prior to applying them to the amplifier chains 104_1 through 104_N. In some implementations, the amplitude of some of the RF signals for the multiple channels can be attenuated as compared to the amplitude of some other of the RF signals for the multiple channels. Although, in the illustrated implementation, the computer 102 is distinct from the RF signal generator 103, in various other implementations, the computer 102 and the RF signal generator 103 can be integrated together.

Each amplifier chain has a plurality of solid-state power amplifiers, each of which has a gate voltage on set point derived from an automatic calibration operation, as detailed below. Some of the plurality of solid-state power amplifiers may be arranged serially/sequentially in some implementations. Some of the plurality of solid-state power amplifiers may be arranged in a power combining configuration. Each amplifier chain produces an amplified RF signal. In one embodiment, a few mW RF signal from the RF signal generator 103 is amplified to a few kWs. The amplifier chain may utilize a combination of solid-state amplifiers, including silicon laterally diffused metal-oxide semiconductors, Gallium Nitride, Scandium Aluminum Nitride, GaAs and InP.

The channels of RF signals from the amplifier chains 104_1 through 104_N are applied to an antenna array 106. Each amplifier chain has a corresponding antenna in the antenna array 106. The antenna array 106 broadcasts the channels of RF signals as a steered composite RF signal with Megawatts of radiated power. That is, individual RF signals emitted from different antennae in the antenna array 106 interact in free space to generate a composite RF signal that is directed to a specified location corresponding to the location of the target. The antenna array 106 may include a mechanical gimbal to position individual antennae. In various implementations, the antenna array 106 can further amplify the RF signal by about 10-1000 times.

The RF signal generator 103 also sends control signals to the power sequencer 105. The control signals gate amplifiers in the amplifier chains 104_1 through 104_N to produce the channels of RF signals. The control signals ensure that little (e.g., micro to nano amps) leakage or quiescent current is drawn when an RF signal is not being generated. The leakage and quiescent current can be quite large in high power amplifiers circuits if not gated. In one embodiment, the RF signals and power gating signals are turned on and off in 10s of nanoseconds.

The amplified RF signals from the amplifier chains 104_1 through 104_N are applied to an antenna array 106. The phased array RF signals form a steered composite RF signal to disable a target, typically when it is approximately 100 meters from the antenna array 106. The steered composite RF signal has Megawatts of radiated power.

System 100 also includes an AC power source 107 for the different elements of system 100. The AC power source may operate with a power distributor 108, which applies power to the power sequencer 105. In one embodiment, the power distributor 108 converts from AC to DC power. Generally, the conversion from AC to DC can happen either locally at each amplifier or at the system level.

Figure 2:
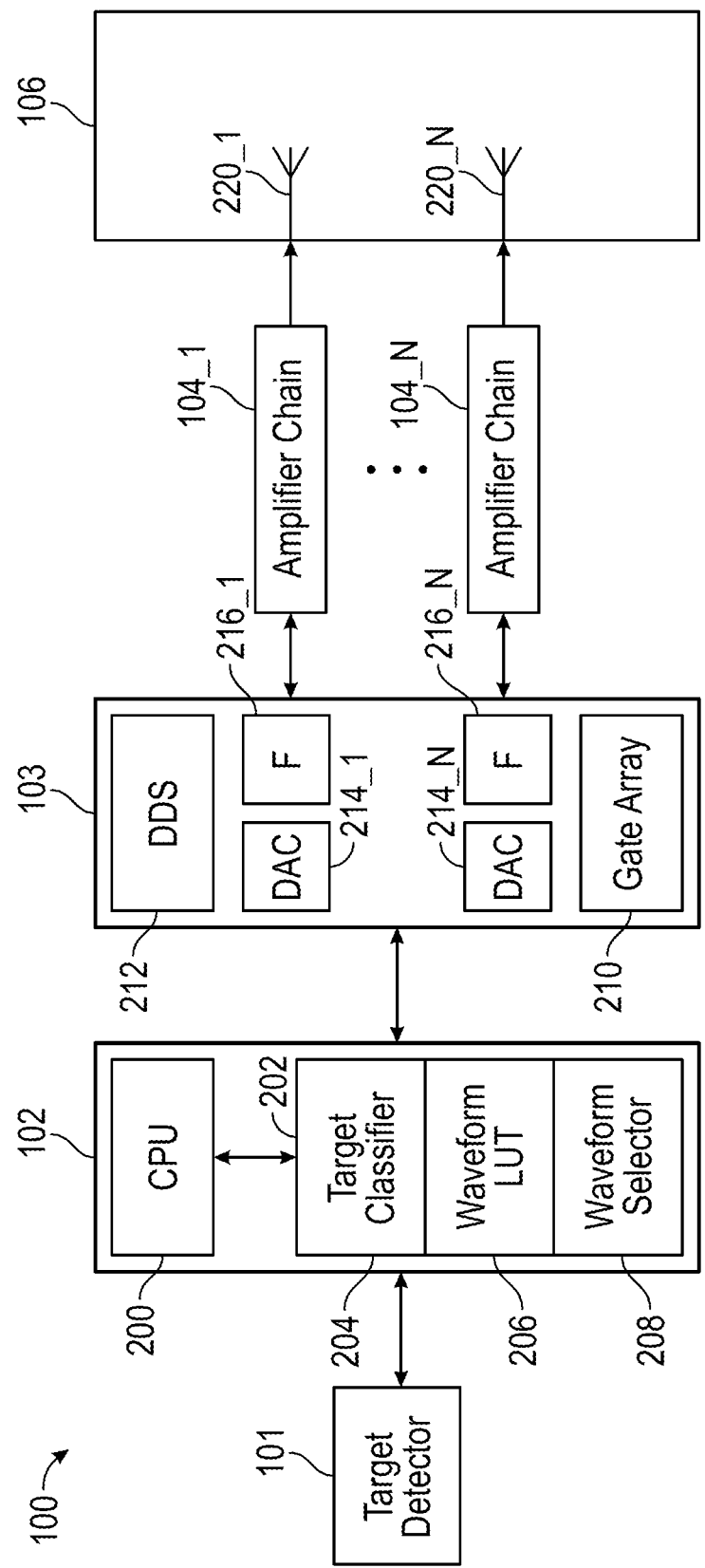
FIG. 2 more fully characterizes components of FIG. 1.

FIG. 2 illustrates details of certain components in system 100. Central computer 102 includes a processor or central processing unit 200 connected to a memory 202. The memory 202 stores instructions executed by processor 200. The instructions include a target classifier 204. In one embodiment, the target classifier 204 matches the signature of the attributes of the target to a waveform in a waveform look-up table 206. The waveform selector 208 designates a waveform to disable the target. The designated waveform also includes free space parameters to ensure that the steered composite RF signal intercepts the target. The steered composite RF signal is formed by a collection of phase offset RF signals. The central computer passes RF waveform parameters to the RF signal generator 103. The RF waveform parameters include information about azimuth angle and elevation angle of the target, azimuth and elevation angle of friendly targets that do not need to be disabled, frequency of the RF waveform, pulse width and duty cycle of the RF pulses, position and height/depth of peaks/nulls in the RF beam.

In one embodiment, the RF signal generator 103 is implemented as an RF system on a Chip Field Programmable Gate array (RFSoC FPGA). The RFSoC FPGA 103 includes a gate array 210 and a direct digital synthesizer 212 that creates waveforms of the frequency, pulse width, pulse repetition interval and intra-pulse modulation specified by the RF frequency waveform parameters generated by the central computer 102. The gate array 210 is configured to perform a variety of functions including but not limited to determining the time intervals at which different components of the amplifier is powered up and powered down. The waveforms are passed to a collection of digital-to-analog (DAC) converters 214_1 through 214_N. Outputs from the DACs 214_1 through 214_N are optionally conditioned by signal conditioning units (SCUs). In various implementations, the SCUs can comprise filters 216_1 through 216_N as depicted in FIG. 2. The filters 216_1 through 216_N may filter the RF signals to a frequency band of interest. In some implementations, the SCUs can comprise one or more phase shifters and/or attenuators that can achieve the desired azimuth and elevation angles for the generated RF beam. The outputs from the RF signal generator 103 are applied to amplifier chains 104_1 through 104_N. Each amplifier chain terminates in an antenna of antenna array 106, such as antennae 220_1 through 220_N. The RFSoC FPGA 103 allows digital formation of signal beams which has several advantages including but not limited to increasing/maximizing signal power in certain regions of space and decreasing/minimizing signal power in certain other regions of space. Accordingly, signal power can be focused on targets in certain regions of space while reducing the signal power on targets in certain other regions of space. Digitally forming signal beams as discussed above also advantageously allow the power, frequency and other parameters of the signal beam to be changed in sufficiently real time (e.g., in less than 1 millisecond).

Figure 3:
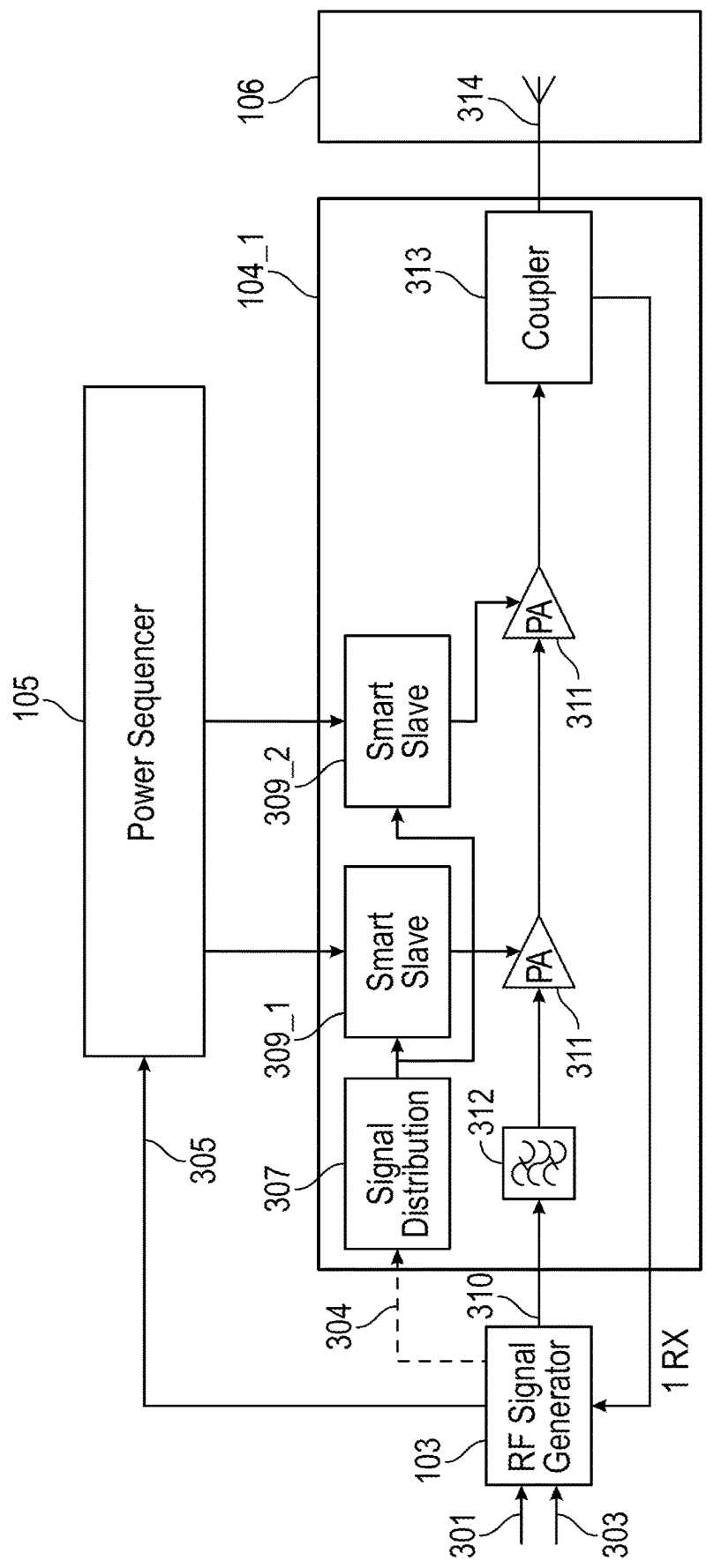
FIG. 3 illustrates a power sequencer.

FIG. 3 is a block diagram of different components of FIGS. 1 and 2, including the RF signal generator 103, power sequencer 105, and an amplifier chain 104_1. The RF signal generator 103 receives a control signal from central computer 102 on node 301. A synchronizing clock signal is received on node 303.

A broadcast signal on node 304, an Ethernet signal in one embodiment, is sent to a plurality of power sequencing smart slave units 309. In the one embodiment, the broadcast signal is distributed through a router 307. The broadcast signal initiates a calibration mode in smart slave circuits 309, such that they identify the optimal "on" set point gate voltage for the power amps 311.

The RF signal generator 103 sends a very fast signal with deterministic delay, such as a Low Voltage Differential Signal (LVDS) to power sequencer 105. The power sequencer 105 operates as a master power sequencing gating unit that simultaneously controls smart slave devices 309. In particular, the power sequencer 105 sends a master voltage to the slave units 309_1 and 309_2. The slave units 309_1 and 309_2 offset this master voltage with their individual voltage offsets that they established in calibration mode, so that each power amplifier has an optimal gate voltage. Many power amplifiers have different optimal set gate voltages for "on" operation; the disclosed circuits can be configured such that each individual power amp 311 has its own set point.

The RF signal generator 103 synchronizes using "on" signals applied to the power sequencers 105. The RF signal generator 103 also applies an RF signal on node 310, which is propagated through power amps 311. The power amp chain may have one or more filters 312. A portion of the RF signal from the amplifier can be tapped by a coupler 313 and sent back to the RF signal generator 103 or the computer 102 for monitoring purposes. The monitored information can include information regarding the phase, amplitude, power level and timing of the power amplifiers. The monitored information is considered to update timing and control algorithms.

The RF signal is amplified through the power amplifiers 311 and is sent to an antenna 314 of the antenna array 106. The output from the different antennae of the antenna array 106 form a steered composite RF signal.

Power efficiency and linearity are important figures of merits (FoMs) for amplifier based systems. Power efficiency in field effect transistor (FET) amplifier (e.g., gallium nitride (GaN) FET amplifier) based systems can be improved by controlling the voltages provided to the gate and the drain terminals of a FET amplifier. Various implementations of a FET or a High Electron Mobility Transistor (HEMT) amplifier that is configured to be operated in saturation can benefit from a bipolar gate supply which can source and sink current. The bipolar gate supply can advantageously maintain the gate voltage at a desired voltage level.

Various implementations described herein include a bipolar high impedance gate driver that can source or sink current when the amplifier is operated at or near saturation. In addition to maintaining the gate voltage at a desired level, the bipolar high impedance gate driver can draw minimal amount of DC current and dynamically provide current to the gate terminal of the amplifier when the signal to be amplified is input to the amplifier. Various implementations of a bipolar high impedance gate driver described herein comprise an operational amplifier (opamp). The bipolar high impedance gate driver can improve various measures of efficiency for amplifier-based systems including drain efficiency, power-added efficiency, total efficiency, amplifier efficiency and wall-plug efficiency.

Figure 4A:
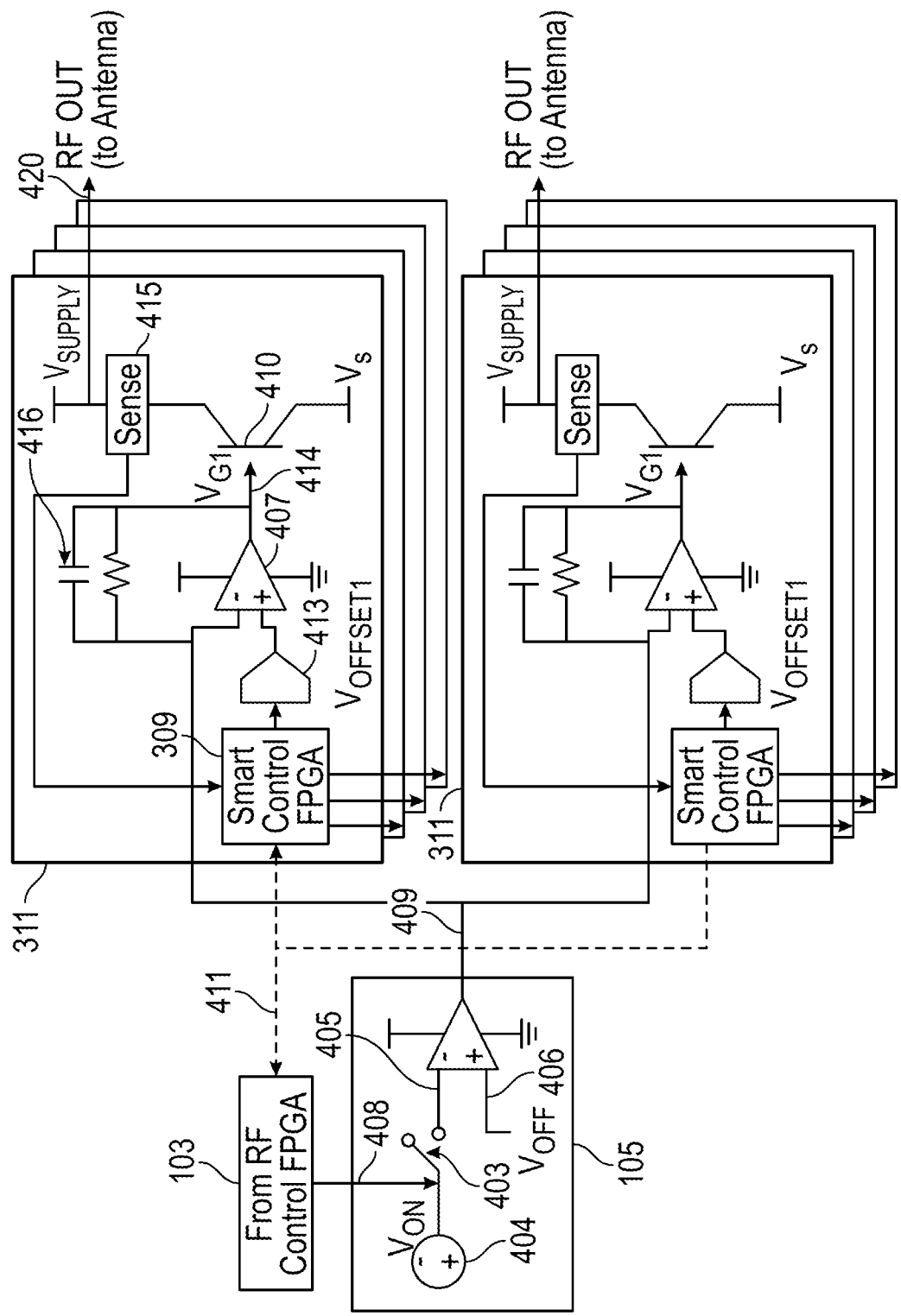
FIG. 4A illustrates power electronics.

FIG. 4A illustrates an implementation of a system comprising a plurality of high power amplifiers (e.g., amplifier 410) that are driven by corresponding bipolar high impedance gate drivers (e.g., driver 407). The voltage and/or current output from the bipolar high impedance gate drivers is controlled by a power controller (e.g., controller 309). As discussed above, the power controller can comprise a master control unit (e.g., power sequencer 105 discussed above) and a plurality of slave control units (e.g., slave units 309_1 and 309_2 discussed above). In some embodiments, the master control unit and the slave control units can be implemented as separate devices. In some other embodiments, the master control unit and the slave control units can be implemented as a single device.

Referring to FIG. 4A, the RF signal generator 103 applying an "on" signal from node 408 to the power sequencer 105, operates as a master power gating and sequencing circuit that controls slave power amplifiers 311. In one embodiment, this signal is a Low voltage differential signal (LVDS) that controls a switch 403, which causes current from power supply 404 to flow during an "on" state and stops current flow in "off" state. The power supply voltage 404 can provide an offset voltage, which is added to an off voltage $V_{OFF}$ 406 when the switch 403 is closed. In some embodiments, the amplifier 410 can be Gallium Nitride devices. In such embodiments, the off voltage $V_{OFF}$ 406 can be about −5 Volts and the power supply voltage 404 can be about 3 volts. Accordingly, the output voltage at node 409 is about −2 Volts, which is approximately the gate voltage that turns on Gallium Nitride amplifiers 410. When the switch is open, the output voltage on node 409 defaults back to the off voltage $V_{OFF}$, which is −5 Volts in one embodiment, which is the gate voltage that turns Gallium Nitride transistors off and reduces leakage current down to about 10 microamps. The value of the off voltage $V_{OFF}$ and the offset voltage can be different from −5 Volts and 3 Volts respectively depending on the turn-on voltage of the amplifier 410. Node 411 carries a broadcast signal that initiates the auto-calibrate operation of the smart slave circuits 309. In one embodiment, each smart slave circuit 309 is implemented with an FPGA configured to determine the optimal gate voltage set point for turning on a slave amplifier.

Digital to analog converter (DAC) 413 provides an offset voltage that gets added to the master voltage on node 409. This offset voltage is tuned to each individual power amplifier 410 to provide optimal set point bias voltage $V_{G1}$ on node 414 and maximum power out from the power amp 410. It also enables optimum voltage in the "off" state and minimizes leakage current. The master-slave architecture facilitates fine grained voltage offsets, which is advantageous in efficient operation of many transistors, which may be sensitive to gate voltage offsets at the millivolt level. In some implementations, the disclosed technology maximizes voltage offset resolution. For example, the master-slave architecture can advantageously change the voltage provided to the gate terminal of the amplifier in increments of 1 millivolt or less.

The smart slave 309 controls a plurality of DACs 413 and stores different optimum set points for both the on and off states for each power amplifier. In the auto-calibration mode, the current sensor 415 is used to feedback a current reading 425 to the smart slave 309. This voltage offset on node 413 is tuned very slightly, by the millivolt in one embodiment, until the current 425 sensed from sensor 415 reaches an optimum current value, as per the data sheets for the power amplifiers 410. This voltage offset is stored. This process is repeated to minimize the current in "off" state. The current can also be sensed during active operation to determine the viability of the power amp. If the current starts to degrade or change or significantly decrease, this can indicate that the amplifier is damaged and needs to be replaced or can indicate that the temperature is out of range for optimal operation. This method of adjusting the voltage offset on node 413 based on the current sensed from 415 is explained in further detail below with reference to FIGS. 8-13.

The capacitor 416 can be tuned (manually or electronically) to change the rise and fall time for the gate bias signal on node 414. For example, in some embodiments, capacitor 416 is real time programmable by the smart control FPGA 309, such as by a series of switches, to include a variable amount of capacitance in the feedback path 416. This is a useful feature because different power amplifiers 410 can each have a different gate capacitance. Capacitor 416 can be tuned based on the gate capacitance for optimal operation. Tuning capacitor 416 affects how fast or slow the rise time is on the gate voltage at node 414, this effects speed and efficiency of the power gating. Changing the charge on capacitor 416 can also change the amount of time the power amplifier rings or oscillates. In other embodiments, capacitor 416 is configured to tune the rise and fall time for very fast operation.

As discussed above, the computer 102 receives a signal from the target detector 101, such as a sensor/camera in some embodiments or radar in other embodiments, and triggers a target detection algorithm. The computer 102 classifies the target and selects a waveform that can disable the target. Various parameters of the waveform and details about the target are transmitted to the RF generator. The computer 102 also triggers the various amplifier chains 104_1 to 104_N with a signal to start the power sequencing for each amplifier in the amplifier chains. The signals are sent to each amplifier in the amplifier chains such that the power sequence is started at the same time, in a coherent, synchronized way. The voltage sequence timing diagram is shown and described below with reference to FIGS. 5 and 6.

As used herein, power sequencing comprises providing appropriate values to the various terminals off an amplifier (e.g., gate, source and drain) turn on/turn off the amplifiers.

Power sequencing also turns on the power gating circuitry, which switches on the voltage/current supply to the amplifiers (e.g., the high voltage power amplifiers). The RF waveform digital circuitry is triggered simultaneously to send an array of RF signal inputs to the amplifier chains. As discussed below with reference to FIGS. 5 and 6, the amplifiers are turned on for short period when a target has been acquired which advantageously allows the system to emit RF signals high peak power (e.g., of the order of Megawatts) with low average power (e.g., less than 5 kW).

Figure 4B:
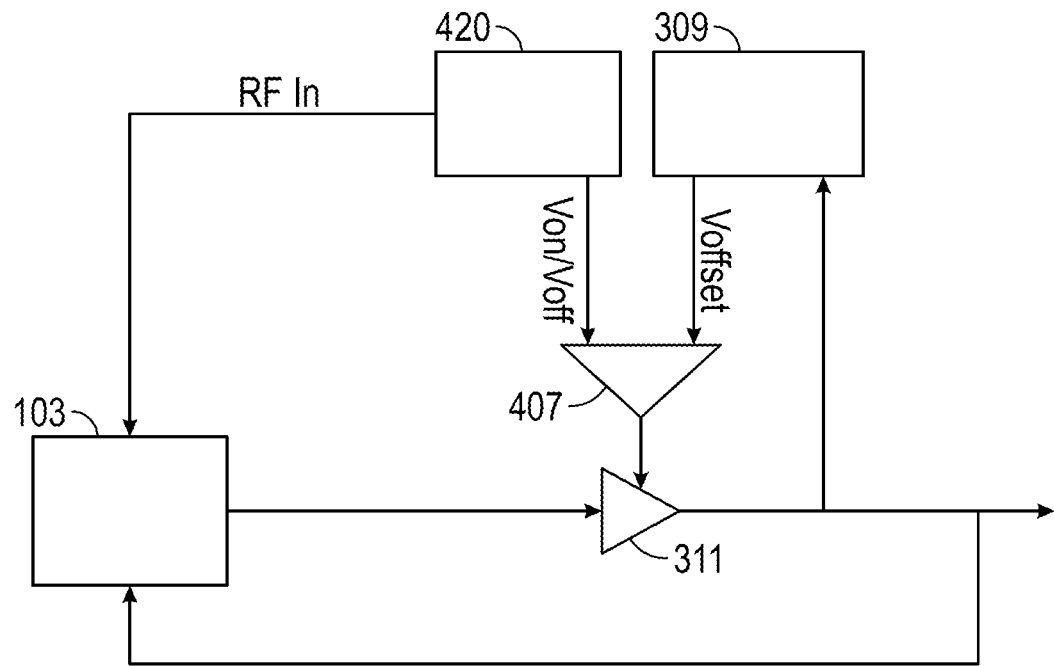
FIG. 4B illustrates an implementation of a gate biasing system comprising a switching element which is triggered by the incoming RF signal.
Figure 4C:
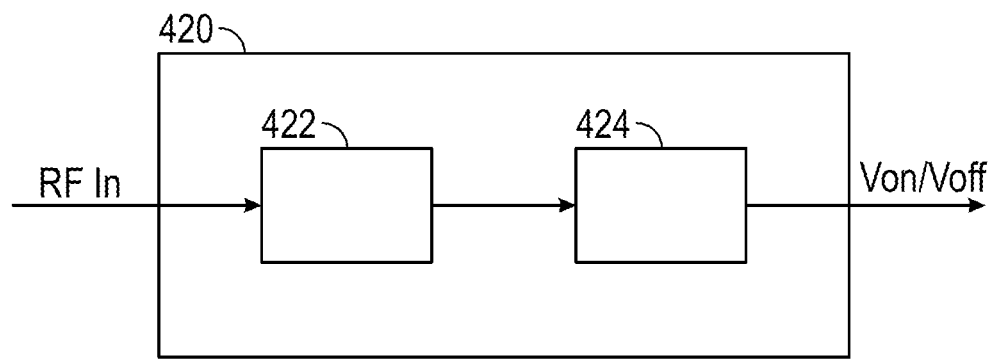
FIG. 4C schematically illustrates the switching element depicted in FIG. 4B.

FIG. 4B schematically illustrates an implementation of a gate biasing system that is triggered automatically by an incoming RF signal. The gate biasing system comprises a switching element 420 which is triggered by the incoming RF signal. FIG. 4C shows an implementation of the switching element 420. The switching element 420 can comprise a Schottky detector 422 and a comparator/switch 424. When the signal generator 103 outputs a RF signal, the Schottky detector produces a RF detect voltage which is greater than a reference voltage of the comparator/switch 424 thereby causing the comparator/switch 424 to be in the closed state and output a bias voltage $V_{ON}$ which turns on the amplifier 311. For an implementation of the amplifier 311 comprising a GaN device, the output voltage $V_{ON}$ can be in a range between −2V and −5V. The slave unit 309 can provide a tunable offset voltage which can the adjust the bias voltage $V_{ON}$ to optimize one or more performance metrics of the amplifier 311. In the absence of the RF signal from the signal generator 103, the switch 424 may be considered to be in the open state which causes a voltage $V_{OFF}$ to be provided to the amplifier 311 which turns the amplifier 311 off. For an implementation of the amplifier 311 comprising a GaN device, the output voltage $V_{OFF}$ can be less than −5.5V, such as, for example, between about −12V and about −6V. The schematic shown in FIGS. 4B and 4C can be an alternate implementation which is triggered by the RF signal itself instead of a control signal from the RF signal generator 103.

Figure 5:
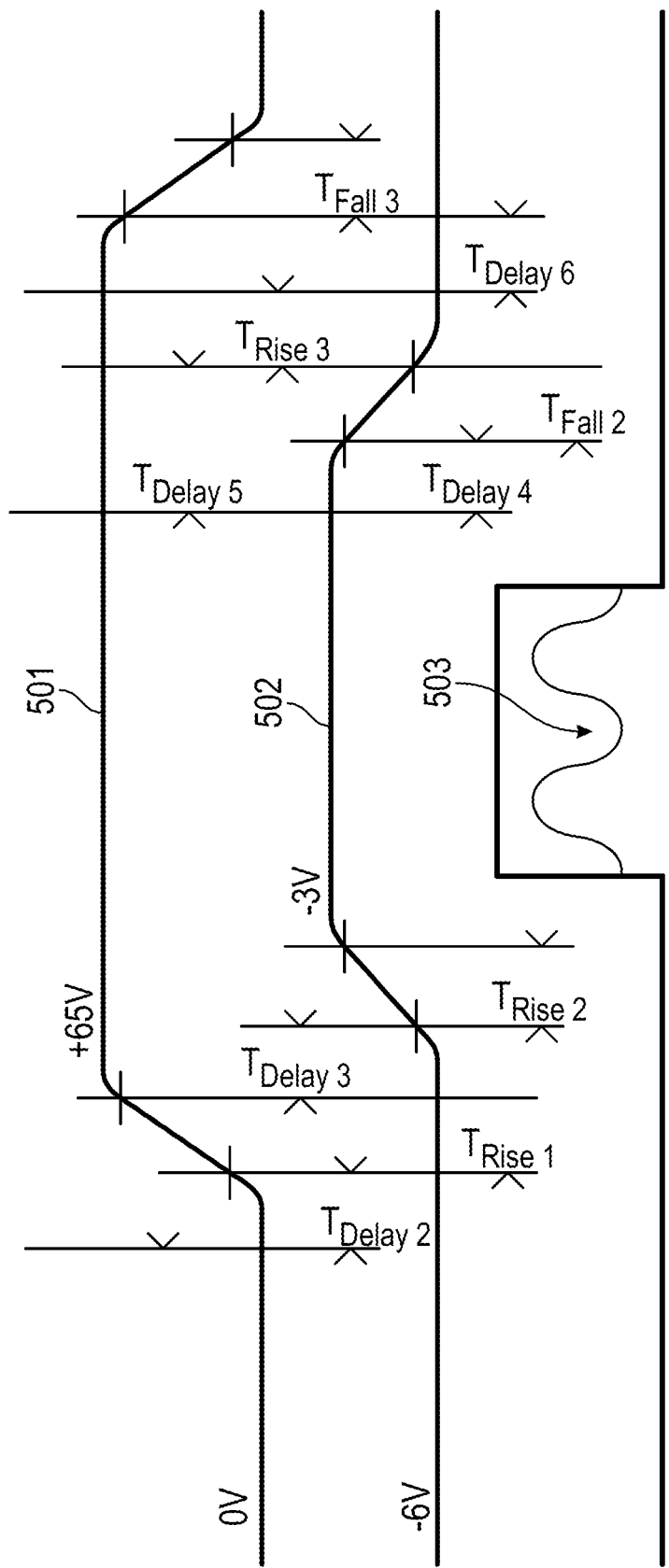
FIG. 5 illustrates power electronics control signals.

FIG. 5 illustrates waveforms that may be used in conjunction with the circuitry of FIG. 4A. The supply voltage 501 ($V_{SUPPLY}$ in FIG. 4A) to the power amp (410 in FIG. 4A) is turned on first. Alternately, it may be left on all the time. The gate voltage waveform 502 is applied to node 414 of FIG. 4A. Then, the RF signal from RF signal generator 103 is applied to node 414. This example is for a 65 Volt Gallium Nitride (GaN) solid state power amplifier, but the principle may generally apply to any solid-state power amplifier. The drain voltage 501 toggles from 0 Volts to 65 Volts. Then, the source current is tuned from −5 Volts to −2 Volts, where it is considered "open" and the transistor is "on" so that a quiescent current starts to flow. Finally, the RF input signal 503 is applied and the transistor draws active power once the RF power is on, in some embodiments up to 30 amps of current create 1,500 watts of power out of the transistor 410.

The RF signal 503 is sent out as a short pulse, for example, as short as 10 ns or as long as milliseconds. The length of the pulse depends on the type of target. After the RF pulse is complete, the source voltage is pinched off back down to −6 Volts, and then shortly after the drain voltage is tuned from 65 Volts down to 0 Volts and the transistor is off and therefore draws minimal current.

Figure 6:
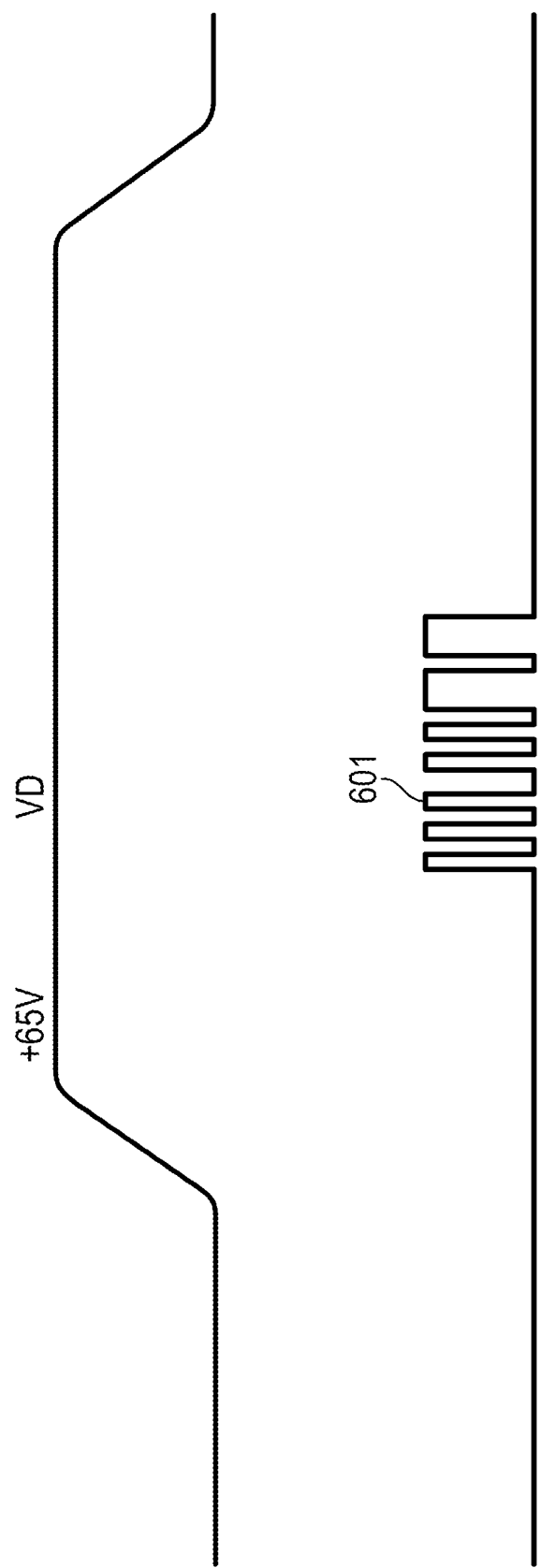
FIG. 6 illustrates an RF signal.

FIG. 6 illustrates a timing diagram showing a non-linear pulse train 601 with uneven pulses. The pulse train 601 is sent through power amp 410, where the RF and voltage bias is turned on and off very quickly (e.g., 10s of nanoseconds). In one embodiment, the pulses are in an arbitrary pattern at a frequency of 1 GHz.

Figure 7:
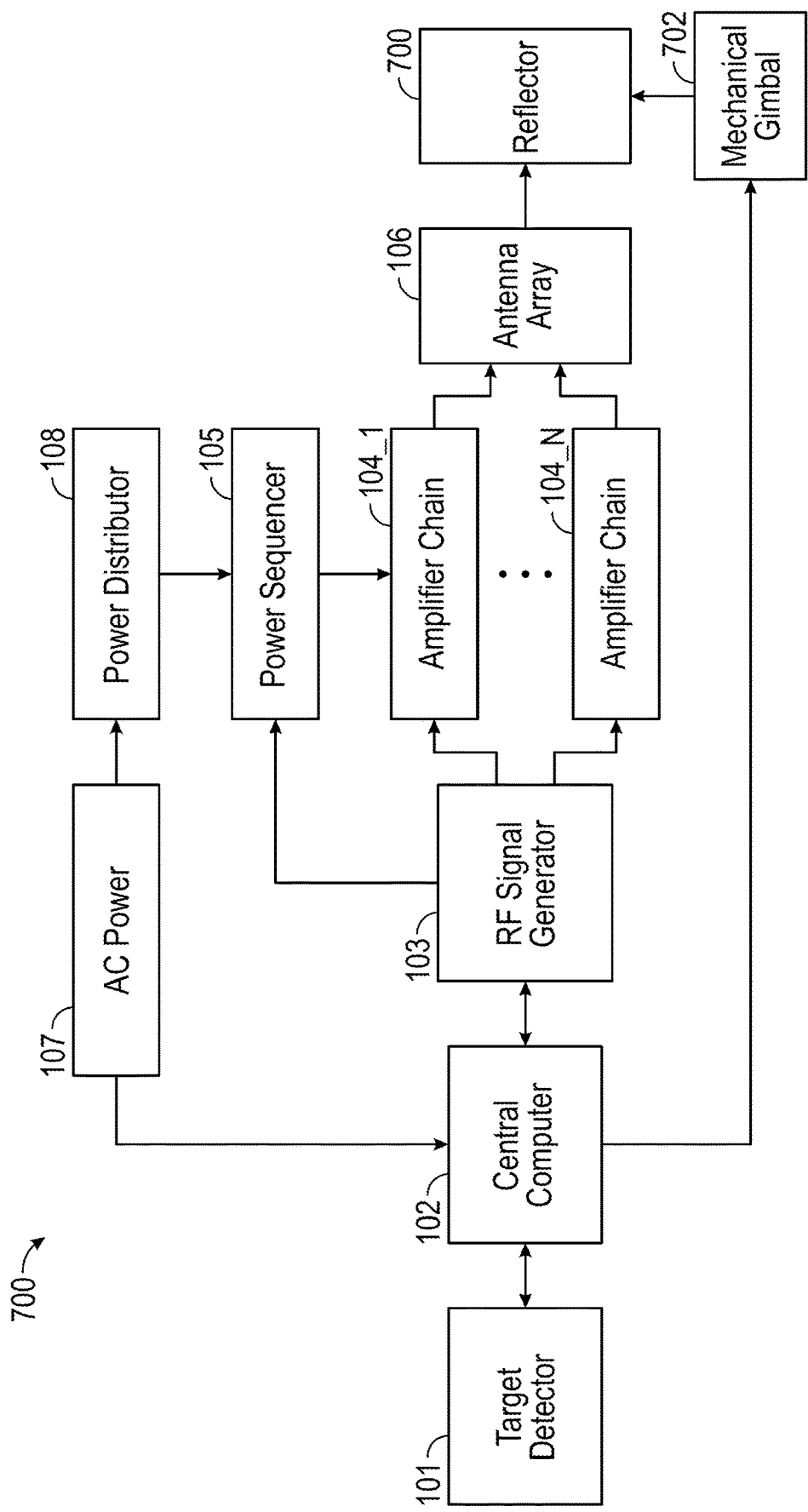
FIG. 7 illustrates the system of FIG. 1 utilizing a reflector and mechanical gimbal.

FIG. 7 illustrates a system 700 corresponding the system 100 of FIG. 1. However, in this embodiment, the antenna array 106 transmits its RF power signal to a reflector 700. For example, 16 antennae operating at the L-band frequency with half-wavelength spacing may transmit into a 3 meter reflector dish. The reflector dish may have a subreflector. A mechanical gimbal 702 may control the position of the reflector 700 in response to control signals from central computer 102.

The 3 meter reflector dish provides 28.1 dBi, or 645× linear magnification of the energy. In one embodiment, the reflector dish is fed by a 16 element phased array antenna in a 4×4 array. At a 1% duty cycle and 70% power efficiency, the power system only requires 550 watts of DC power output, enabling a small power supply.

The implementations of the phased array systems described above are configured to be software defined via element level digital control of each channel of the phased array. The RF signal input to the phased array can be generated digitally without requiring RF or analog components using novel transmitter schemes (e.g., a monobit transmitter).

Power Management System to Adjust Bias Condition of RF Amplifiers

Figure 8A:
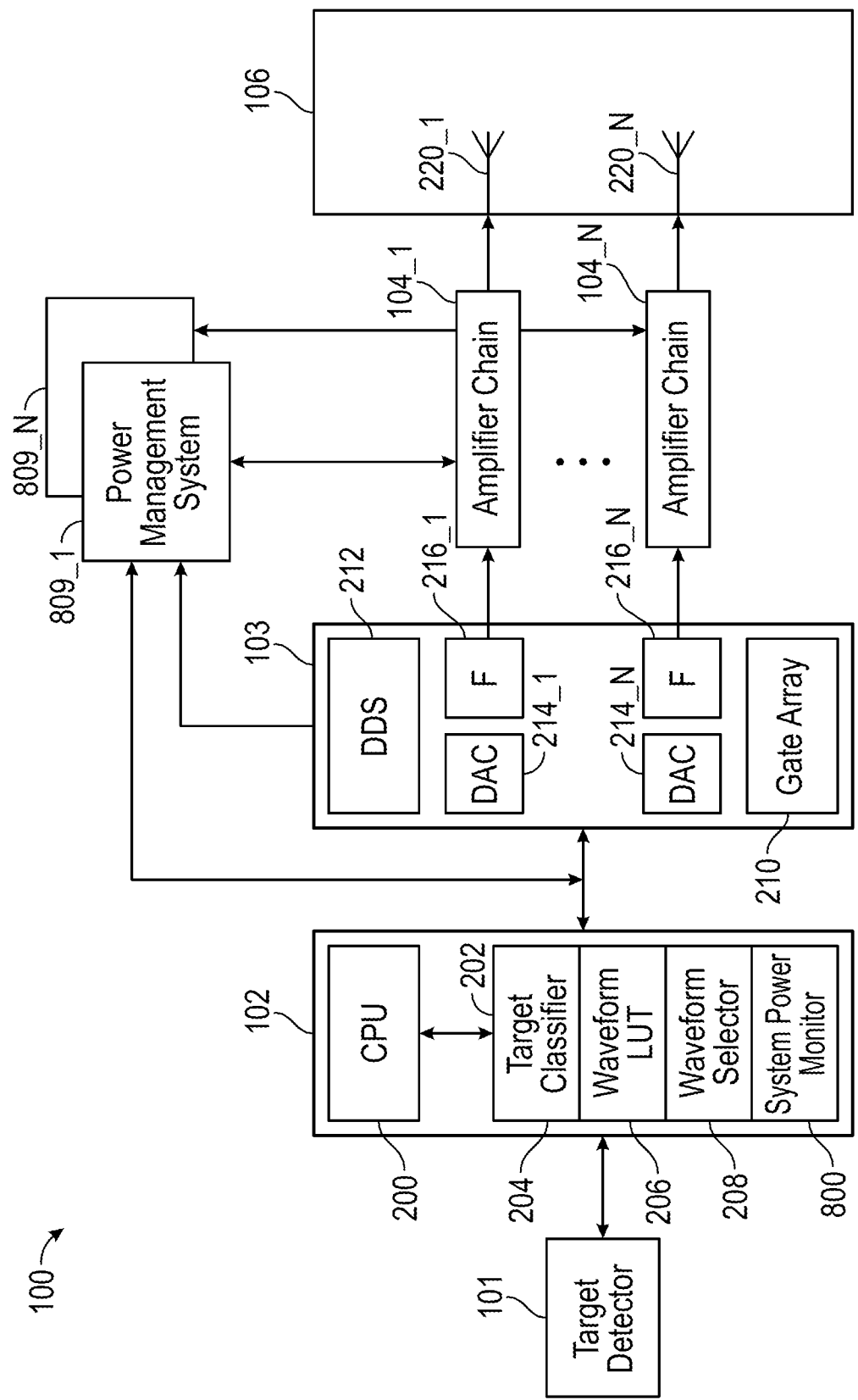
FIG. 8A illustrates another implementation of the system of FIG. 2.

FIG. 8A illustrates another implementation of the system 100 of FIG. 2. The system 100 is illustrated as being augmented with a plurality of power management systems 809_1 to 809_N configured to provide the required voltages and currents to efficiently operate the amplifiers in the amplifier chains 104_1 to 104_N. In various implementations, the power management systems 809_1 to 809_N can comprise or be associated with a power distributing system similar to the power distributor 108 and/or a power sequencing system similar to the power sequencer 105. Individual power management systems 809_1 to 809_N are configured to (i) in response to receiving a signal from the RF generator 103 provide appropriate bias voltages and currents to turn-on the amplifiers in the corresponding amplifier chains 104_1 to 104_N prior to/synchronously with the arrival of the RF signal from the RF generator 103; (ii) adjust or change the bias voltages and currents to the amplifiers based on information obtained about the input signal characteristics, output signal characteristics, system operating conditions (e.g., operating temperature, operating currents/voltages at various terminals of the amplifier/system, etc.), an input received from a user or an electronic processing system controlling the biasing systems and/or by information obtained from look-up tables that provide an understanding of the state of the amplifier; and/or (iii) reduce the bias voltages and currents to turn-off the amplifiers in the corresponding amplifier chains 104_1 to 104_N in response to absence of signal to be amplified or a sensed characteristic (e.g., input signal power, output signal power, temperature, gate current/voltage or drain current/voltage) being outside a range of values.

As discussed above, the plurality of power management systems 809_1 to 809_N can comprise sensors (e.g., current sensors) that can sense current values (e.g., drain and/or gate current values) of the individual amplifiers in the amplifier chains 104_1 to 104_N. The power management systems 809_1 to 809_N can be configured to sense the current values of the individual amplifiers in the amplifier chains 104_1 to 104_N intermittently (e.g., periodically). In some implementations, the power management systems 809_1 to 809_N can be configured to sense the current values of the individual amplifiers in the amplifier chains 104_1 to 104_N continuously. In various implementations, the output from the current sensor can be sampled using an analog to digital converter (ADC) and averaged over a number of samples (e.g., 128 samples, 512 samples, etc.) to obtain the sensed current value.

The sensed current value can be analyzed by the power management systems 809_1 to 809_N to determine an operational or a physical characteristic (e.g., temperature, input/output signal power, voltage/current at various terminals of the amplifier) of the individual amplifier. For example, a sensed current value above a first threshold current value when the amplifier is not turned on can be indicative of a defect in the amplifier or a defect in the circuit board on which the amplifier is mounted. As another example, a sensed current value above a second threshold current value when the amplifier is turned on but no signal to be amplified is provided to the input can be indicative of a defect in the amplifier or a rise in the temperature of the amplifier. As yet another example, a sensed current value above a third threshold current value when the amplifier is turned on and a signal to be amplified is provided to the input can be indicative of a defect in the amplifier or a rise in the temperature of the amplifier. Accordingly, the power management systems 809_1 to 809_N can be configured to compare individual amplifier current values to target amplifier current values to identify an amplifier state error. In response to determining that the amplifier current value of a particular amplifier has deviated from a target amplifier current value (e.g., first, second or third threshold values discussed above), the power management system controlling that particular amplifier is configured to determine the amount by which values of the voltages/current provided to the amplifier should be offset to achieve efficient operation of the amplifier and provide that offset value. In various implementations, one or more of tasks of correlating the sensed current values to a physical characteristic of the amplifier or determining the amount by which values of the voltages/current provided to the amplifier should be offset by to achieve efficient operation of the amplifier can be performed by the computer 102 instead of the power management systems 809_1 to 809_N.

The target amplifier current values may be based upon several factors for optimal system operation. For example, the target amplifier current values may be calibration amplifier current values for specified temperatures. The target amplifier current values may be calibration amplifier current values to compensate for amplifier manufacturing process variations. The target amplifier current values may be calibration amplifier current values to compensate for voltage variations. The target amplifier current values may be calibration amplifier current values to compensate for radio frequency phase variations. The target amplifier current values may be historical performance amplifier current values. The historical performance amplifier current values may be used to identify amplifier degradation over time.

Without any loss of generality, the plurality of power management systems 809_1 to 809_N can comprise a variety of sensors. For example, the plurality of power management systems 809_1 to 809_N can comprise voltage sensors configured to measure voltages at the various parts of the amplifiers in the amplifier chains 104_1 to 104_N. As another example, the plurality of power management systems 809_1 to 809_N can comprise temperature sensors configured to measure temperature of the amplifiers in the amplifier chains 104_1 to 104_N. The temperature sensors can be configured to measure the device temperature of the amplifiers in the amplifier chains 104_1 to 104_N or temperature of the housing or the mount on which the amplifiers in the amplifier chains 104_1 to 104_N are disposed.

Figure 8B:
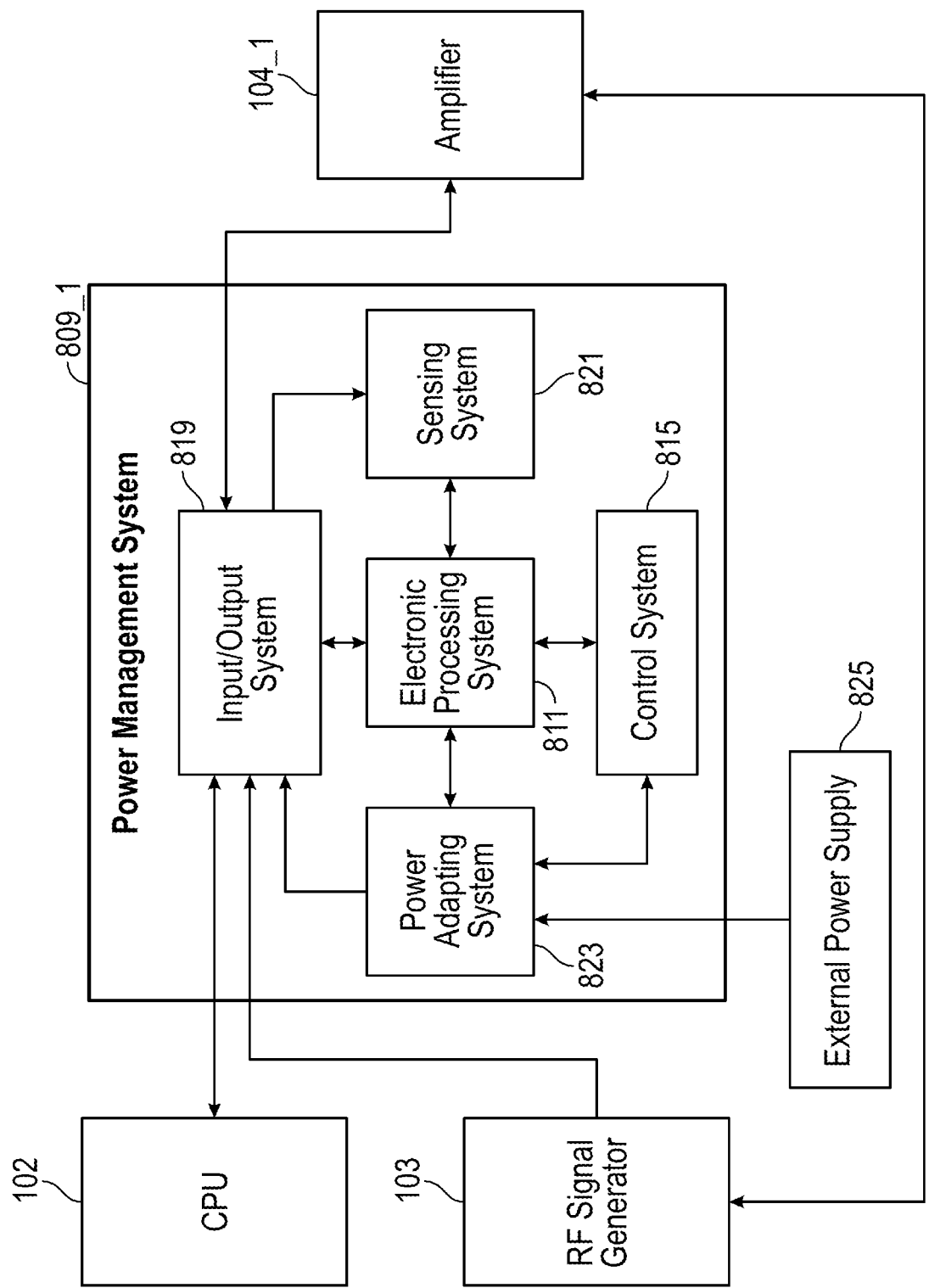
FIG. 8B illustrates an implementation of a power management system.

FIG. 8B illustrates an implementation of the power management system 809_1. The power management system 809_1 can include various functional sub-systems, such as an electronic processing system 811, a control system 815, a memory (not shown), a sensing system 821, a power adapting system 823, and an input/output system 819. The various functional sub-systems can be integrated in a single housing or in separate housings. In implementations where the different functional sub-systems are integrated in separate housings, the separate housings can include processing electronics and communication systems to communicate and function properly. For example, in some implementations, the power adapting system 823 and the sensing system 815 can be integrated in a separate housing. In such implementations, the electronic processing system 811 in cooperation with the control system 815 and the memory can provide signals to the power adapting system 823 to turn-on/turn-off the biasing voltages and currents to the amplifiers in response to receiving a signal from the RF generator 103 indicating the start/end of the RF signal and/or receiving information from the sensors that one or more sensed parameters are out of a range of values.

The power management system 809_1 can be implemented with a form factor of a field programmable gate array (FPGA) or an application specific integrated circuit (ASIC). The ASIC implementation may be advantageous to realize smaller form factors. The power management system 809_1 is configured to obtain information about the signals to be amplified and monitor various currents and voltages of the amplifier to optimize and control operating currents and voltages of the amplifier. The power management system 809_1 can obtain the information about the signals to be amplified and the currents/voltages at various terminals of the amplifier in real time or substantially in real time. For example, the power management system 809_1 can obtain the information about the signals to be amplified and the currents/voltages at various terminals of the amplifier in a time interval less than about 1 second, in a time interval greater than or equal to about 1 millisecond and less than about 1 second, in a time interval greater than or equal to about 1 second and less than about 10 seconds, in a time interval greater than or equal to about 10 seconds and less than about 30 seconds, in a time interval greater than or equal to about 30 seconds and less than about 1 minute and/or in a range defined by any of these values.

The power management system 809_1 can provide several benefits including but not limited to increasing/optimizing power efficiency for a desired performance criterion. For example, consider that an amplifier in the amplifier chain 104_1 being controlled by the power management system 809_1 is operated in a high gain regime to provide a certain amount of RF output power. The power efficiency of that amplifier can be higher than a similar amplifier that is operated in a high gain regime to provide the same amount of RF output power but is not controlled by the power management system 809_1. As another example, consider that an amplifier in the amplifier chain 104_1 controlled by the power management system 809_1 is operated to provide a certain amount of gain and linearity. The power efficiency of that amplifier can be higher than a similar amplifier that is operated to provide the same amount of gain and linearity but is not controlled by the power management system 809_1. The use of the power management system 809_1 can also reduce direct current (DC) power consumption during operation of an amplifier as compared to direct current (DC) power consumption by an amplifier driven without a power management system 809_1. The power management system 809_1 can improve linearity of an amplifier, help in automatic calibration of an amplifier over temperature, voltage and process variations, and/or autocalibration of a phased array system.

The electronic processing system 811 can comprise a hardware processor that is configured to execute instructions stored in the memory which will cause the power management system 809_1 to perform a variety of functions including, but not limited to, turning on/off or reduce voltages/currents provided to various terminals of an amplifier in response to detecting that the signal to be amplified is turned on/off or sensing individual amplifier current values and change the values of different voltages and currents in response to the deviations of the sensed current values from target values.

The input/output system 819 can be configured to provide wired/wireless connection with external devices and systems. For example, the input/output system 819 can comprise an Ethernet port (e.g., a Gigabit Ethernet (GbE) connector) that provides connection to the computer 102 and/or a router, one or more connectors that provide connection to the RF signal generator 103, a connector that provides connection with an external power supply, a plurality of connectors that provide voltages/currents to one or more amplifiers, a plurality of connectors that can receive voltage/current information from the one or more amplifiers, and connectors that provide connection with a user interface (e.g., a display device). In various implementations, the input/output system 819 can comprise a command and control link to receive messages from the RF generator 103 and/or computer 102.

The input/output system 819 can be configured to receive as input, a signal/trigger/information from the RF signal generator 103 and use the information from this input to determine the voltages and current for an amplifier in the amplifier chain 104_1. As discussed above, the input received from the RF signal generator can be a trigger that conveys information that the RF signal will be turning on in a short while and causes the power management system 809_1 to start the power sequencing process and provide appropriate voltages and/or currents to bias the amplifiers in the corresponding amplifier chain 104_1 prior to the arrival of the RF signal. For example, the input from the RF signal generator can be a pulse enable signal which is high when the RF signal is on and low when the RF signal is off. In various implementations, the input from the RF signal generator 103 can be representative of the waveform being output by the DAC 214_1 of the RF generator 103. In some implementations, the input can include instructions and/or settings to power on the power management system 809_1, to power up an amplifier in the amplifier chain 104_1, and other data to operate the power management system 809_1 and an amplifier in the amplifier chain 104_1.

The input/output system 819 can comprise a communication system configured to communicate with external devices and systems. For example, the input/output system 819 can comprise Ethernet connectivity to send information including but not limited to amplifier health information, and efficiency statistics to the computer 102. Ethernet connectivity can also help in synchronizing an array of many power management systems in phased array applications. The input/output system 819 comprises a plurality of connectors that are configured to provide voltages/currents to at least one terminal of an amplifier in the amplifier chain 104_1. For example, the voltages and currents required to bias at least one of the gate, source and/or drain terminal of an amplifier in the amplifier chain 104_1 can be provided through the output ports of the power management system 809_1. The power management system 809_1 can be configured to provide bias voltage and/or current to a plurality of amplifiers. For example, the power management system 809_1 can be configured to provide bias voltage and/or current to two, four, six or more amplifiers.

The sensing system 821 can be configured to sense current values at one or more terminals of the amplifier as discussed above. In various implementations, the sensing system 821 comprises at least one current sensor and an analog to digital converter (ADC) configured to sample and average the output of the current sensor (e.g., sensor 415) to obtain a sensed current value. In another implementation of the sensing system 821, the voltage drop across a resistor (e.g., a shunt resistor) connected to the drain terminal is measured. The drain current is obtained from the measured voltage drop and the value of the resistor. In such an implementation, the sensing circuit is designed to have low offset voltage and low noise which allows for greater accuracy in the measurement of the drain current. In various implementations, the current sensor need not be integrated with the other components of the sensing system 821 and/or the other sub-systems of the power management system 809_1. Instead, the current sensor can be integrated with the amplifier. The number of current sensors can vary based on the number of amplifiers being controlled by the power management system 809_1 and the number of currents that are being monitored. For example, if the power management system 809_1 is configured to control four distinct amplifiers and it is desired to monitor the drain current of each of the four separate amplifiers, then the power management system 809_1 comprises four current sensors configured to monitor the drain current of each of the four distinct amplifiers.

The power adapting system 823 can be configured to convert power from an external power supply 825 (e.g., an AC power line, a battery source, a generator, etc.) to voltage and current waveforms required for operating the amplifiers being controlled by the power management system 809_1. For example, in various implementations, the power adapting system 823 is configured to convert a 60V DC bus and generate appropriate voltage and current inputs for the various terminals of the amplifier. In some implementations, the power adapting system 823 may be configured to convert an incoming AC power line to DC power (e.g., DC voltages between about +20 Volts DC and about +80 Volts DC). The power adapting system 823 is configured to step up/down the converted DC voltage to appropriate voltages for the amplifier (e.g., in a voltage range between about +45 Volts and +70 Volts high voltage Gallium Nitride power amplifiers) through DC/DC converters. The stepped up/down voltages are provided to the various terminals of the amplifier (e.g., gate, drain, and/or source) in a sequence as discussed above in response to receiving a signal from the RF signal generator 103 and/or the computer 102 that the signal to be amplified is turned on/being turned on.

In various implementations, the power management system 809_1 comprises a "power gating" feature where the bias voltage/current at various terminals (e.g., gate and/or drain) of the amplifier is adjusted in response to a sensed characteristic of the system. In various implementations, the power management system 809_1 can provide offset voltages that raise and lower the biasing voltage to turn on/turn off the power amplifier in response to the turning on and turning off the RF signal. For example, in an implementation of the amplifier chain 104_1 comprising a GaN power amplifier, the power management system 809_1 can toggle the gate voltage between about −5V (pinch off or turn off) and about −2.5V (saturation or turn on) at a frequency greater than or equal to 1 kHz and less than or equal to about 500 MHz. As another example, the gate voltage can be toggled between pinch off and saturation at a rate greater than or equal to about 10 MHz and less than or equal to about 100 MHz. Without any loss of generality, the power management system 809_1 can be configured to turn-on and turn-off the amplifier in between pulses of a pulsed waveform. This can advantageously allow heat to dissipate from the amplifier in between pulses thereby reducing the rate at which the amplifier heats up and increase lifetime. Turning on and off the amplifier in between pulses of a pulsed waveform can also advantageously increase the power efficiency of the amplifier.

The control system 815 can be configured to control and/or manage various functions and processes of the power management system 809_1. For example, the control system 815 independently or in co-operation with the computer 102 and/or the RF generator 103 can control the order in which the voltage and current levels at various terminals of the amplifier are changed to power up/down the amplifier. As another example, the control system 815 independently or in co-operation with the computer 102 and/or the RF generator 103 can control the raising and lowering of the voltage/current levels at the gate terminal of the amplifier synchronously with the incoming signal to be amplified. As yet another example, the control system 815 independently or in co-operation with the computer 102 and/or the RF generator 103 can control the timing of turning on the various amplifiers in the amplifier chains 104_1 to 104_N.

Figure 8C:
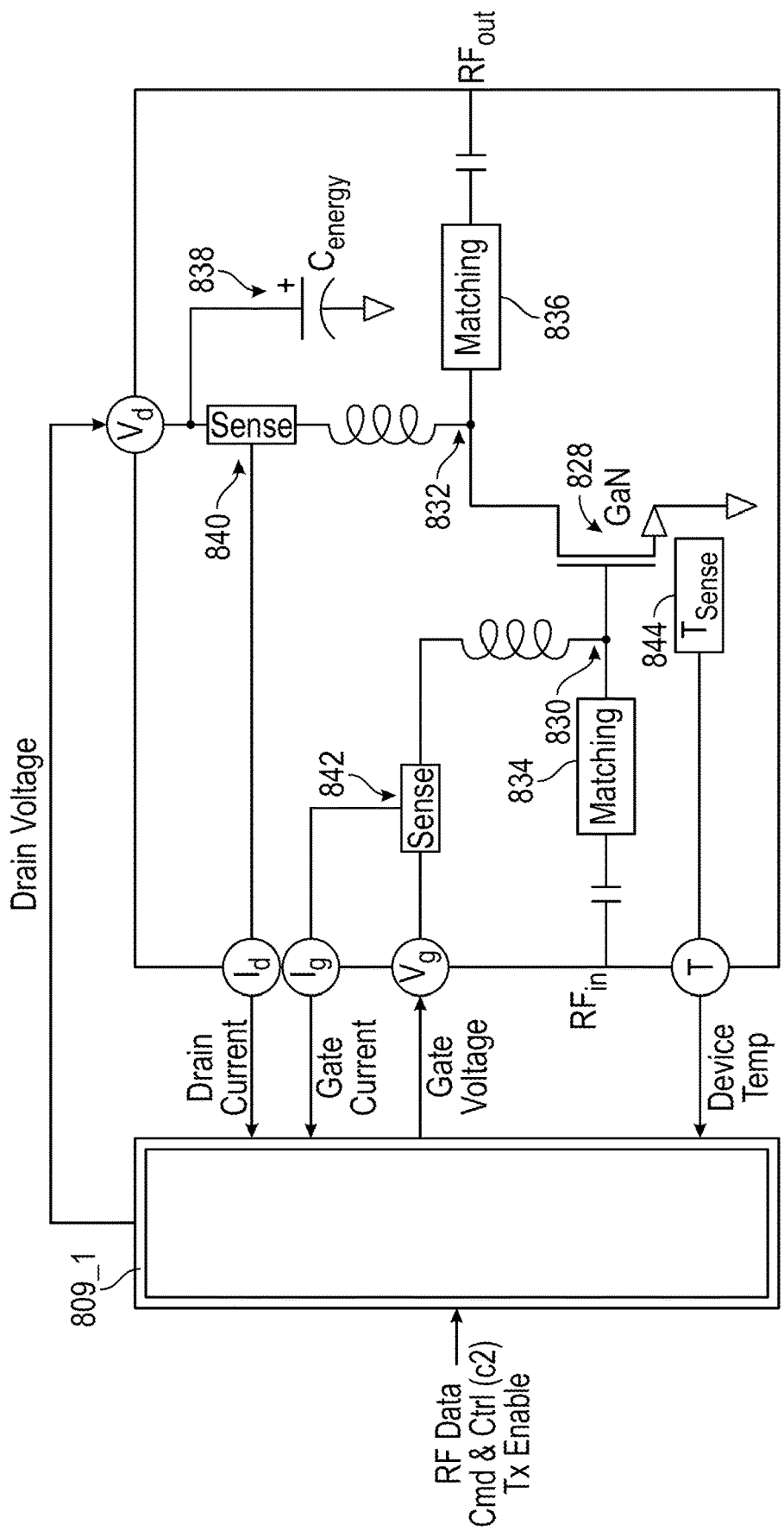
FIG. 8C is a schematic illustration of an amplifier in the amplifier chain that is being controlled by the power management system.

As discussed above, the power management system 809_1 can be configured to use the information about the signal to be amplified to adjust/tune bias voltages and currents that power up/down one or more amplifiers in the amplifier chain 104_1 to improve various figures of merit (e.g., power efficiency, linearity, etc.). FIG. 8C is a schematic illustration of an amplifier 828 in the amplifier chain 104_1 that is being controlled by the power management system 809_1. The amplifier 828 is a FET amplifier having a gate terminal 830 and a drain terminal 832. As discussed above, the power management system 809_1 is configured to provide voltage/current to the gate terminal 830 and the drain terminal 832 of the amplifier as well as adjust the voltage/current levels at the gate terminal 830 and the drain terminal 832 based on information regarding the incoming signal and/or information regarding the temperature and other physical characteristics of the amplifier 828.

The signal to be amplified can be input to the gate terminal 830 via an input matching circuit 834. The amplified signal can be output from the drain terminal 832 via an output matching circuit 836. To ease the burden on the power adapting system 823, one or more storage capacitors 838 are placed near the drain terminal 832 of the amplifier 828. The illustrated implementation comprises a single storage capacitor 838. The storage capacitors can have a capacitance value between about 700 microfarads and 2000 microfarads. The presence of the storage capacitors 838 are advantageous in high power applications and/or applications in which the signal has a high duty cycle. In implementations comprising a plurality of capacitors, the plurality of capacitors can be arranged in parallel. As discussed above, the power management system 809_1 comprises a plurality of current sensors 840 and 842 that are configured to sense/monitor drain and gate current respectively. The current sensor 840 configured to monitor/sense drain current can be positioned downstream of the storage capacitor 838 as shown in the illustrated embodiment or upstream of the storage capacitor 838 in other embodiments. As discussed above, the power management system 809_1 can also comprise a temperature sensor 844 configured to sense/monitor the ambient temperature in the vicinity of the amplifier 828. For example, the temperature sensor 844 can be configured to measure the temperature of the circuit board on which the amplifier 828 is mounted.

In various implementations, the power management system 809_1 can be configured to protect the amplifiers from damage. The power management system 809_1 can be configured to monitor voltages and/or currents at various terminals of the amplifier and turn-off the amplifier if the current and/or voltage at one or more terminals of the amplifier exceeds a certain limit. For example, the power management system 809_1 can be configured to turn off an amplifier in the amplifier chain 104_1 if the drain current of that amplifier exceeds a preset threshold. The threshold drain current for the various amplifiers controlled by the power management system 809_1 can be programmed and stored in a memory accessible by the power management system 809_1. The threshold drain current can be different when the RF signal is on and off. As another example, the power management system 809_1 is configured to turn-off the amplifier if the rate of increase of the drain current of an amplifier during power up sequence is below a threshold rate. The threshold rate of increase of the drain current for the various amplifiers controlled by the power management system 809_1 can be programmed and stored in a memory accessible by the power management system 809_1. In various implementations, the power management system 809_1 can be configured to monitor the duration of time an amplifier is on and turn off the amplifier if an amplifier is on for an amount time greater than a preset amount of time even if the RF signal is on. The preset amount of time can be programmed and stored in a memory accessible by the power management system 809_1. In various implementations, an input switch can be provided in the input signal path of the amplifier. In such implementations, the power management system 809_1 can be configured to open the input switch and disconnect the RF signal from the input to the amplifier if the voltage, current and/or duration of time the amplifier is on exceeds a limit. In various implementations, a load switch can be provided in the drain path of the amplifier. In such implementations, the load switch can be opened to disconnect the drain and prevent damage to the amplifier if the drain current exceeds a limit.

The bias voltage/current of an amplifier (e.g., a GaN power amplifier) that optimizes the power efficiency of amplifier can vary based on the device temperature. Thus, the power efficiency of an amplifier can degrade from an optimum power efficiency as the temperature of the amplifier changes. Without relying on any particular theory, the temperature of the amplifier can increase over the duration of time that the amplifier is in use. Thus, it is advantageous to intermittently obtain a measurement/estimate of the temperature of the amplifier during use and adjust the bias voltage/current to optimize power efficiency and/or other figures of merit of the amplifier. The bias voltage/current that optimizes power efficiency can also be affected due to degradation in the device performance due to defects during manufacturing, aging or a defect in the circuitry surrounding the amplifier.

Figure 9:
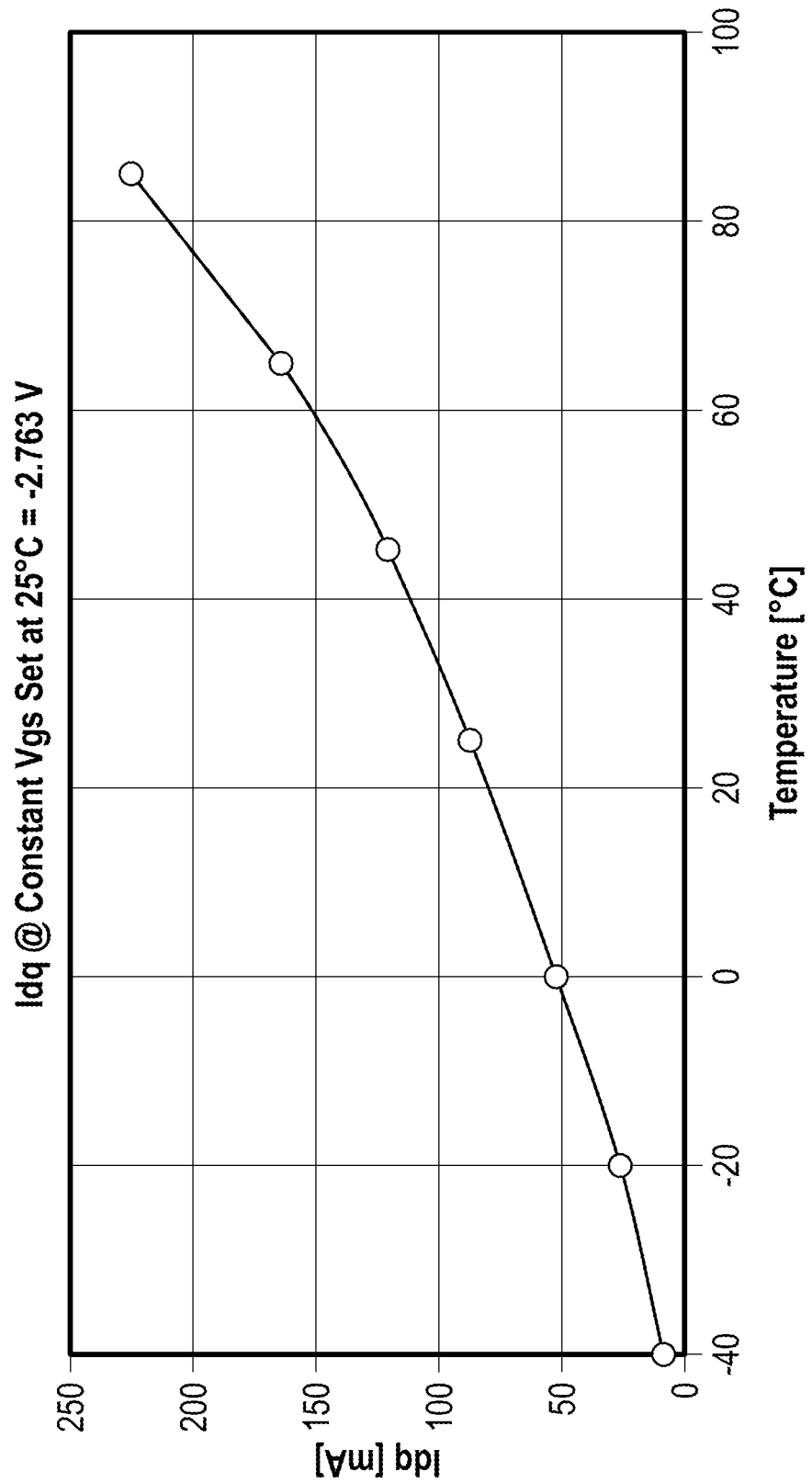
FIG. 9 illustrates the correlation between the drain current and the device temperature for an implementation of a FET amplifier.

While, the temperature sensor 844 in FIG. 8C may provide information regarding the ambient temperature around the amplifier 828. In many implementations, it may not be practical to use a temperature sensor to obtain an estimate of the device temperature of the amplifier 828. However, the drain current can be correlated to the device temperature of the amplifier 828 and can be used to measure the device temperature of the amplifier 828. FIG. 9 illustrates the correlation between the drain current and the device temperature for an implementation of a FET amplifier. In FIG. 9, the embodiment of the FET amplifier is biased at a gate voltage of −2.763V and the drain current changes from about a few milliamps to about 225 milliamps as the temperature of the embodiment of the FET amplifier rises from about −40 degrees Celsius to about 100 degrees Celsius. The variation of the drain current versus temperature can be different when the biasing gate voltage is changed.

The drain current can also provide an indication of a degradation in the performance of the amplifier 828 as a result of defects due to manufacturing/aging or a defect in the circuitry surrounding the amplifier. Thus, adjusting the biasing voltages/currents based on measuring the drain current can advantageously aid in optimizing power efficiency and other figures of merit of the amplifier 828. The drain current can be obtained under bias condition when the signal to be amplified is absent, when the signal to be amplified is present and/or in between signal pulses. For example, in some implementations, the sensor 840 can be configured to sense the drain current continuously or almost continuously. As discussed above, analog-to-digital converters in the power management system 809_1 sample the sensed current. A measurement of the drain current is obtained by averaging over a plurality of samples of the sensed current. The electronic processing system 811 can be configured to correlate the measured drain current to the device temperature of the amplifier 828. The electronic processing system 811 can be configured to correlate the measured drain current to the device temperature of the amplifier 828 using algorithms and/or look-up-tables (LUTs).

As the device temperature of the amplifier 828 changes, the biasing gate voltage that would achieve power efficient operation can change. Accordingly, in many implementations, the electronic processing system 811 of the power management system 809_1 can be further configured to change the biasing gate voltage based on the device temperature obtained from the measured gate current. The electronic processing system 811 can be configured to obtain the amount by which the gate voltage should be changed (also referred to herein as gate offset voltage) using algorithms and/or look-up-tables (LUTs). The gate offset voltage can be in a range between about 1 mV and about 500 mV. In various implementations, the signal to be amplified is turned off before changing the gate voltage by the offset amount. In some implementations wherein the signal to be amplified comprises pulses, the gate voltage is changed by the offset amount in the time interval between pulses. In some implementations, the gate voltage is changed by the offset amount when the signal to be amplified is on.

Figure 10:
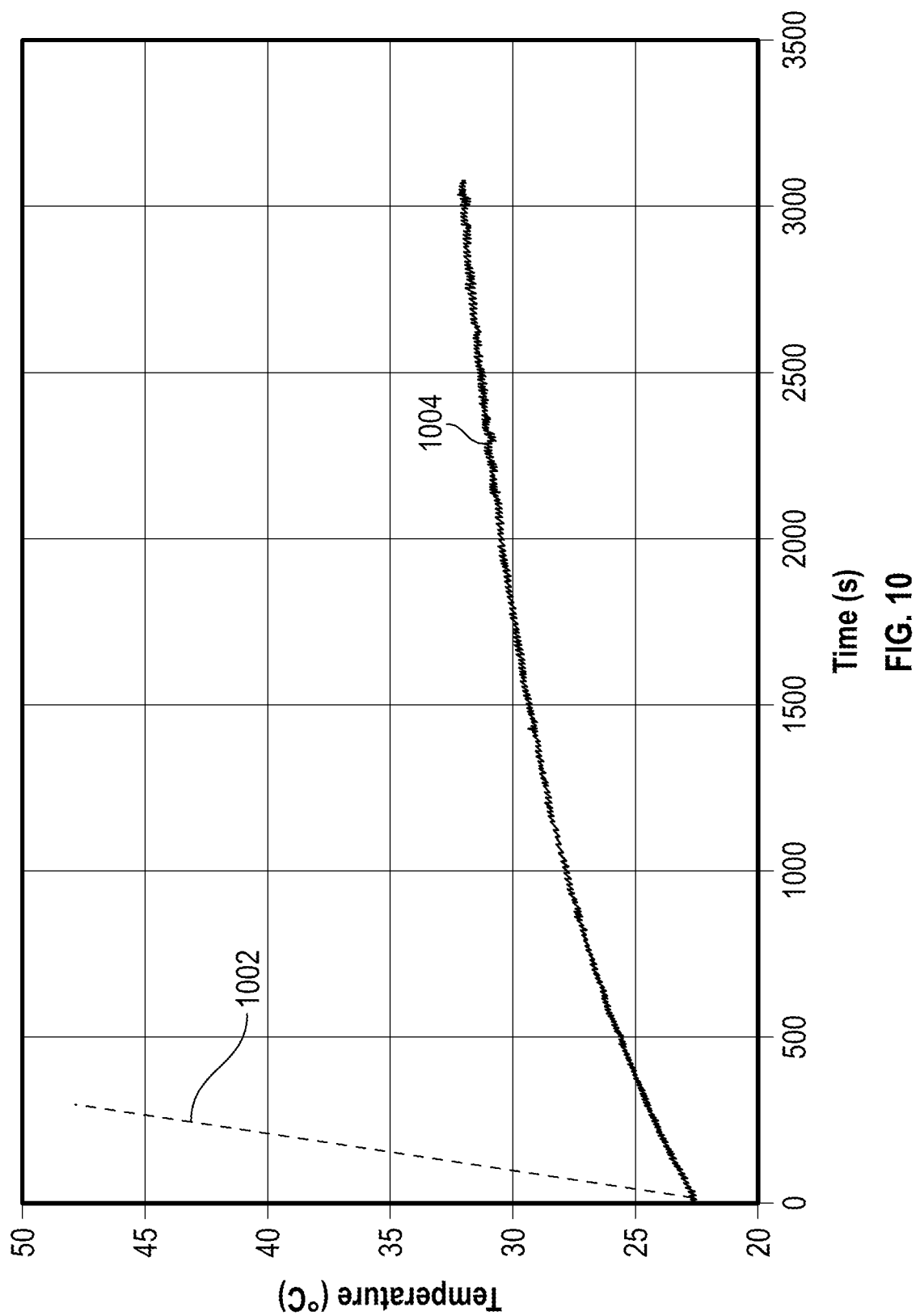
FIG. 10 shows the rise in temperature for two different operating conditions of an amplifier.

In addition to optimizing power efficiency based on device temperature and/or achieving a desired power efficiency at different temperatures, the power management system 809_1 can also help in preventing a rapid increase in the device temperature by adjusting the gate bias voltage as the drain current changes to maintain an optimal gain and/or power efficiency. This is discussed in further detail with reference to FIG. 10. An implementation of an amplifier controlled by the power management system 809_1 is operated in two modes. In both the operating modes, the bias voltage to the gate terminal of the amplifier is turned on a short time before a RF signal is input to the amplifier and turned off a short time after the RF signal is turned off. For example, the gate bias voltage can be turned on/off at a duty cycle of 1%. However, in the first operating mode the gate bias voltage is maintained at a constant voltage, while in the second operating condition the gate bias voltage is changed as the drain current changes. The effect of changing the gate bias voltage with the drain current not only increases/maximizes the gain provided by the amplifier over time but also prevents a rapid increase in the temperature of the amplifier over time. This is illustrated in FIG. 10 which shows a curve 1002 exhibiting a rapid rise in the temperature of an amplifier over time when operated in the first operating mode and a curve 1004 exhibiting a gradual rise in the device temperature of an amplifier over time when operated in the second operating mode. As noted from curve 1002, the temperature of the amplifier can increase from about 22 degrees Celsius to about 48 degrees Celsius in less than 500 seconds when the amplifier is operated in the first operating mode. In contrast, the temperature of the amplifier increases gradually from about 22 degrees Celsius to about 32 degrees Celsius in about 3000 seconds when the amplifier is operated in the second operating mode. Accordingly, systems including amplifiers controlled by a power management system 809_1 that is configured to turn on/off the amplifier based on the presence/absence of the signal to be amplified as well as adjust the gate bias voltage based on the monitored drain current can operate efficiently and/or provide nearly constant gain at a wide range of temperatures (e.g., between about −20 degrees Celsius and about 90 degrees Celsius). In various implementations, by adjusting the gate bias voltage based on monitored drain current can maintain substantially constant power efficiency across a range of temperatures between about −20 degrees Celsius and about 90 degrees Celsius. For example, by adjusting the gate bias voltage based on monitored drain current the power efficiency can be maintained to be within ±10% of a desired value for temperatures between −20 degrees Celsius and about 90 degrees Celsius. The desired power efficiency value can be in a range between 40% and 75%. Such systems can also operate without the need for large and/or expensive cooling systems. In fact, many systems including amplifiers controlled by a power management system 809_1 that is configured to turn on/off the amplifier based on the presence/absence of the signal to be amplified as well as adjust the gate bias voltage based on the monitored drain current can function without any cooling systems, such as for example, electrical or electro-mechanical cooling systems.

Figure 11A:
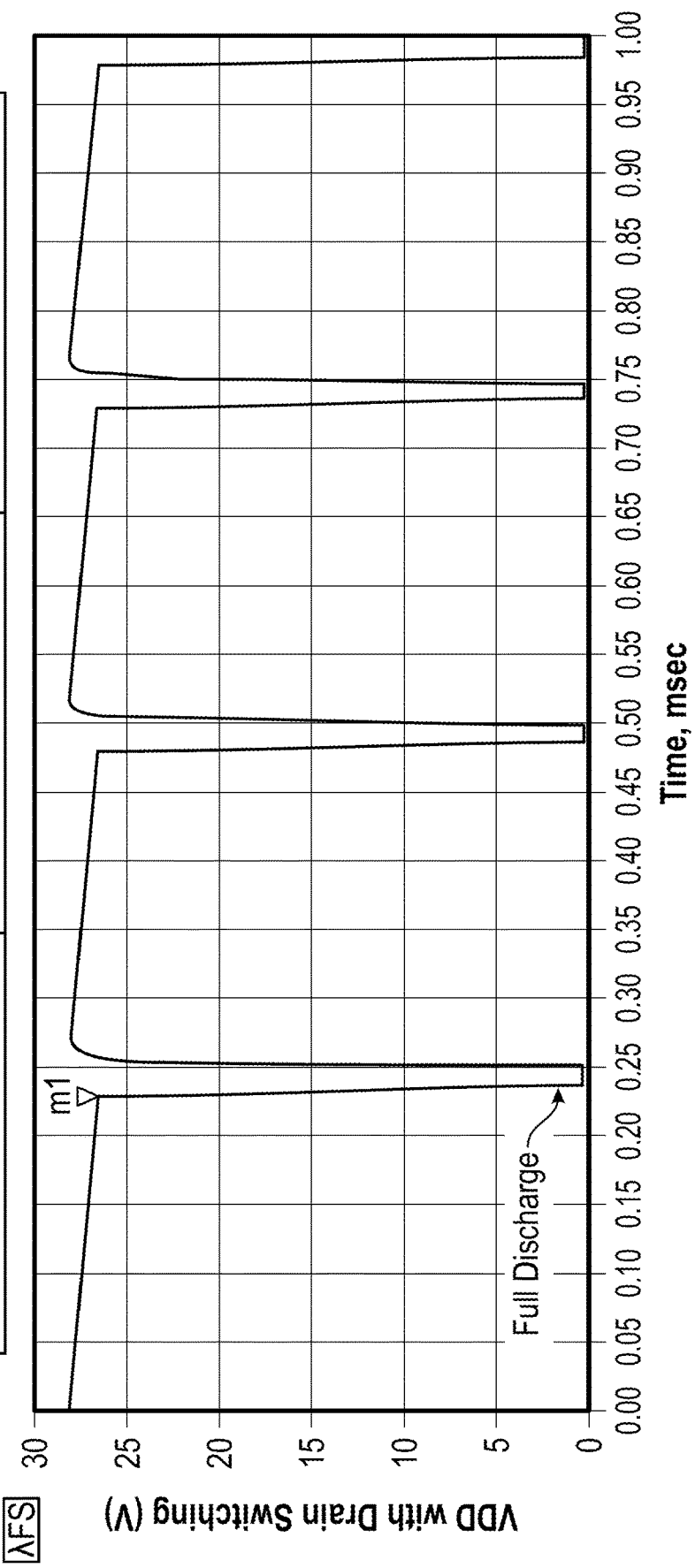
FIGS. 11A and 11B show the effects of gate switching and drain switching in charging storage capacitors.
Figure 11B:
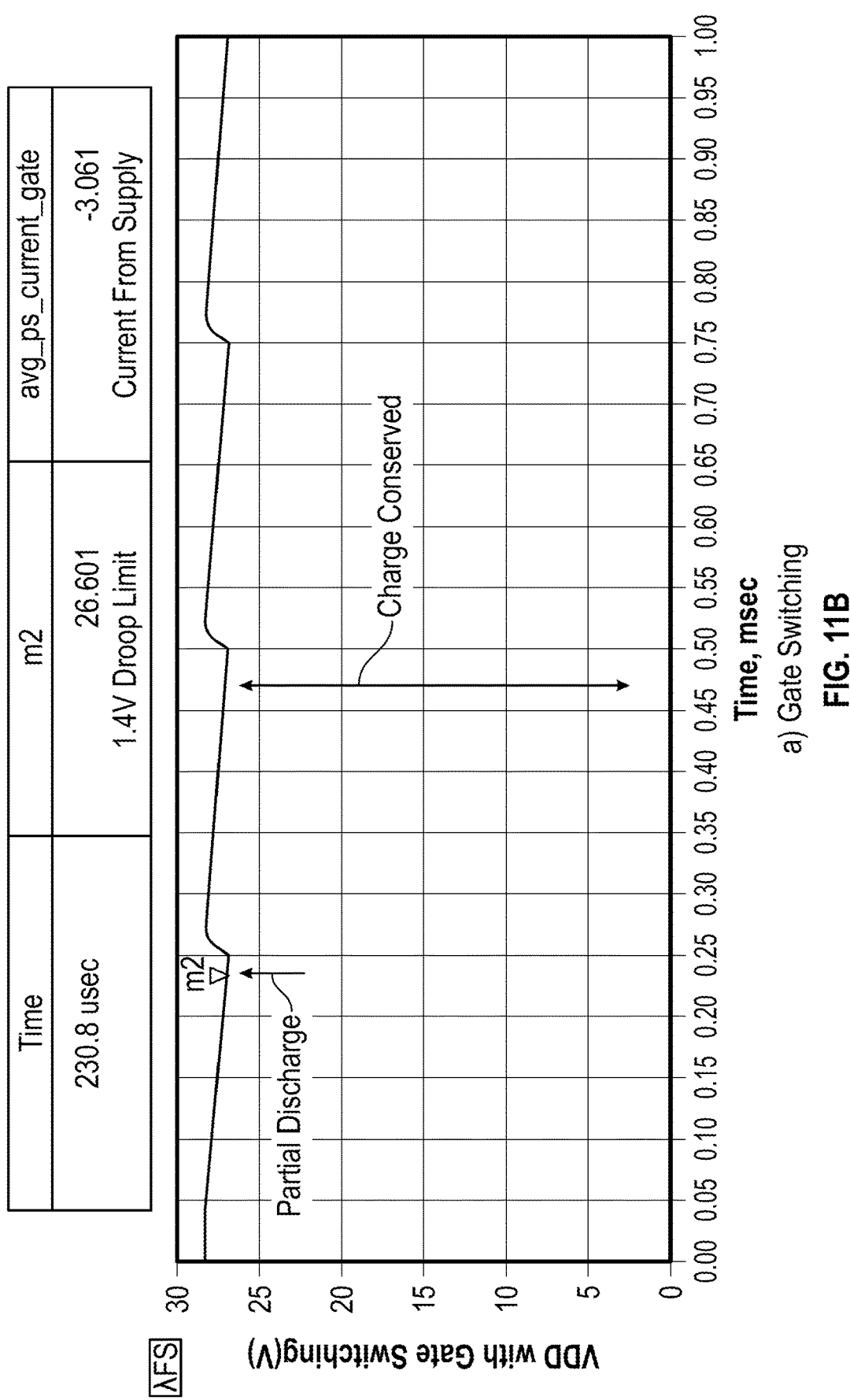

Another advantage of synchronizing the turning on/off the bias voltage to the gate terminal with the turning on/off the input signal is an increase in power efficiency. As discussed above, a storage capacitor 838 may be provided near the drain terminal of the amplifier 828 in various implementations. Depending on the pulse width and duty cycle requirements, the storage capacitor 838 can have a large capacitance value (e.g., between 700 μF and 2000 μF). If the drain current is turned on/off synchronously with the input signal, a large amount of energy is required to charge the storage capacitor 838 as shown in FIG. 11A. In contrast, the capacitors near the gate terminal have lower capacitance values and the energy required to charge those capacitors can be between 10-20 times lower than the energy required to charge the storage capacitor 838 as shown in FIG. 11B.

Accordingly turning on/off the gate bias voltage (referred to herein as gate switching) instead of modulating the drain current/voltage (referred to herein as drain switching) can advantageously increase power efficiency of the amplifier.

Figure 12:
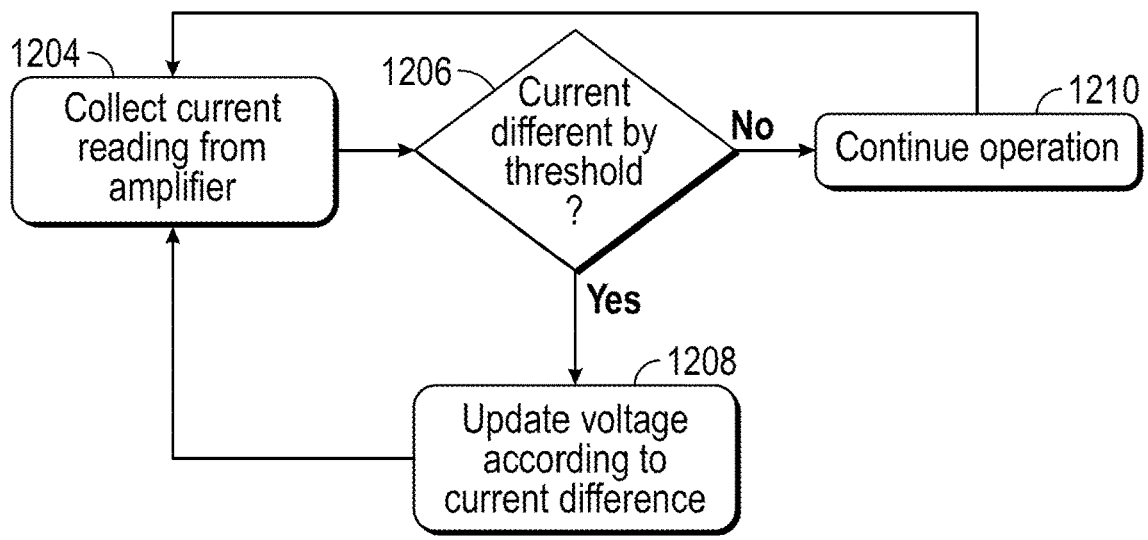
FIG. 12 illustrates a flow chart of operations performed by the power management system.

FIG. 12 illustrates a flow chart of operations performed by the power management system 809_1. The drain and/or gate current from the amplifier can be monitored as shown in block 1204. As discussed above, the drain and/or gate current can be monitored using the sensing system 821. The drain and/or gate current can be sensed continuously or intermittently (e.g., periodically). As discussed above, the sensed current can be sampled and averaged to obtain a measurement of the current. The obtained current measurement can be correlated to a temperature as discussed above. In various implementations, a range for the drain and/or gate current defined by an upper current threshold value and a lower current threshold value can be provided for various gate bias voltages. For a given gate bias voltage, the power efficiency of the amplifier is optimized if the drain and/or gate current is within the provided current range. Accordingly, if the measured current is different from a threshold value (upper current threshold or lower current threshold) as shown in block 1206, then the gate bias voltage can be changed as shown in block 1208. The power management system 809_1 can change the gate bias voltage when the incoming signal is turned off or in-between pulses of the incoming signal. Otherwise, the operation can continue as shown in block 1210.

Figure 13:
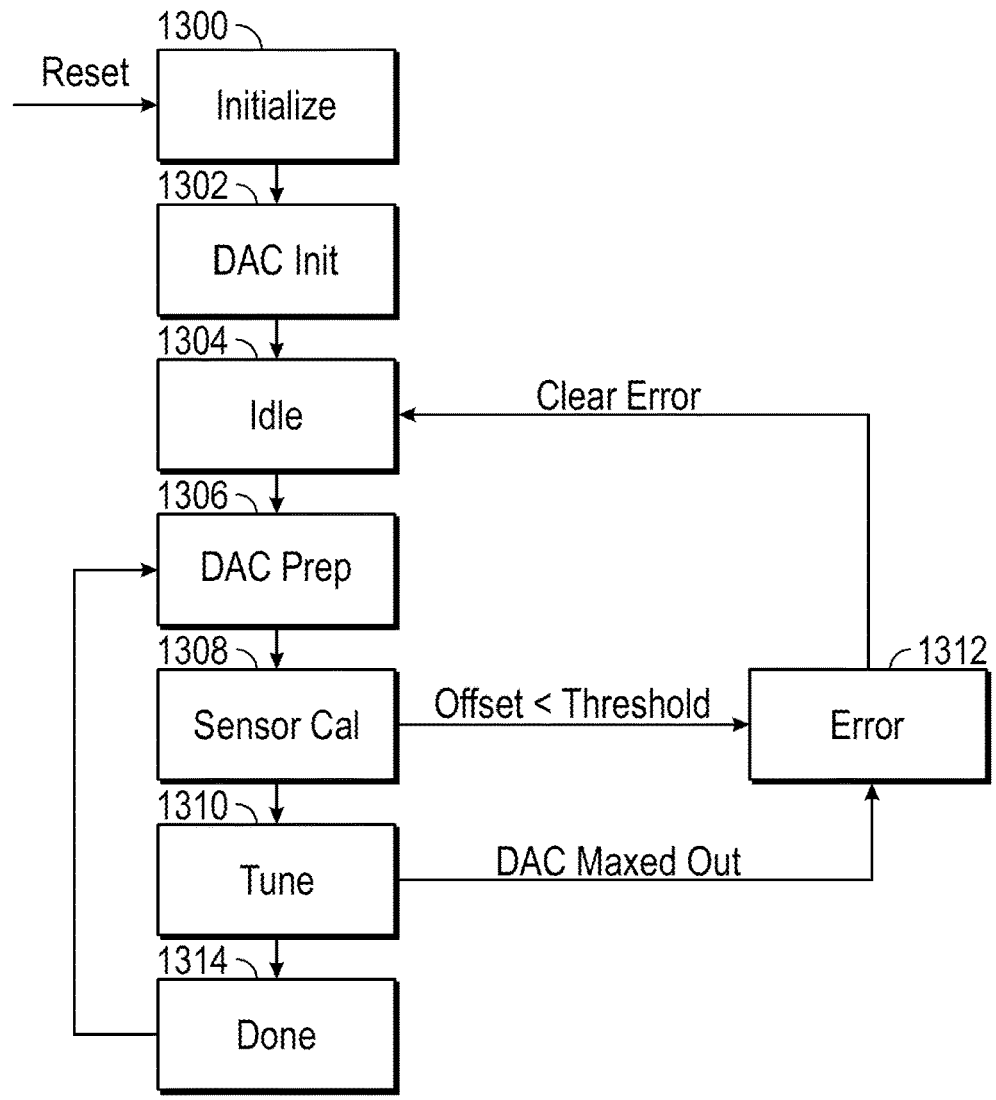
FIG. 13 illustrates a process implemented by a smart slave circuit.

FIG. 13 illustrates a process implemented by the smart slave circuit 309. A reset command is received to commence an initialization operation 1300. The digital-to-analog converter is initialized 1302. That is, the voltage range of DAC 413 is set to appropriate output values for an amplifier being controlled, such as +/−5V.

Once the DAC voltage is set, an idle state is entered 1304. The idle state is maintained until a tune command is received. A tune command invokes a DAC prepare state 1306, where the voltage is set to a specified level, such as −5V. A sensor calibration state 1308 is then entered. In one embodiment, the sensor is calibrated for a 0 amp voltage offset. The offset is subtracted from all incoming samples at the analog-to-digital converter interface that can receive the current sense signal 425 from current sensor 415. If the offset is less than a threshold, an error state 1312 is entered. Otherwise, a tune state 1310 is entered. In this state, a new bias voltage (Vg) is used to direct the current sense signal 425 to the desired value. If the DAC is maxed out, the error state 1312 is entered. Otherwise, a completion state 1314 is entered to determine whether processing should return to state 1306 to try to obtain an improved current sense signal 425.

The operations of FIG. 13 may be substituted with other approaches to establish an optimal current range. For example, the current range can be experimentally tested ahead of time and manually programmed or hard coded into the system. The system can also use machine learning or artificial intelligence techniques to find the optimal current. In other embodiments, signals are fed back into the tuning algorithm instead of just the current 425. Other signals include the RF output signal 420. A coupler (e.g., 313 in FIG. 3) can be used to determine the RF output level. For example, a bias voltage may be applied, a test RF signal is sent, which is read through the coupler into the RF signal generator 103. This procedure is repeated until an optimal saturated RF power output value is obtained. Different optimization criteria are available, such as optimize for power out, such as to achieve 3 dB into power amplifier saturation. Another criterion is to optimize for linearity, such that the RF power is in the linear range. In one embodiment, a pre-programmed voltage bias is used and then 10 mV adjustments above and below the pre-programmed voltage are used until the optimal voltage is achieved.

The RF output power can be tracked by coupler 313. This information is relayed to the power management system 809_1. As the RF power out for a given bias voltage or current for a given bias voltage starts to drop, the power management system 809_1 recognizes that the amplifier is degrading. The amount of degradation is mapped to the lifetime of the amplifier. Reports on amplifier state are periodically issued by the power management system 809_1.

Figure 14:
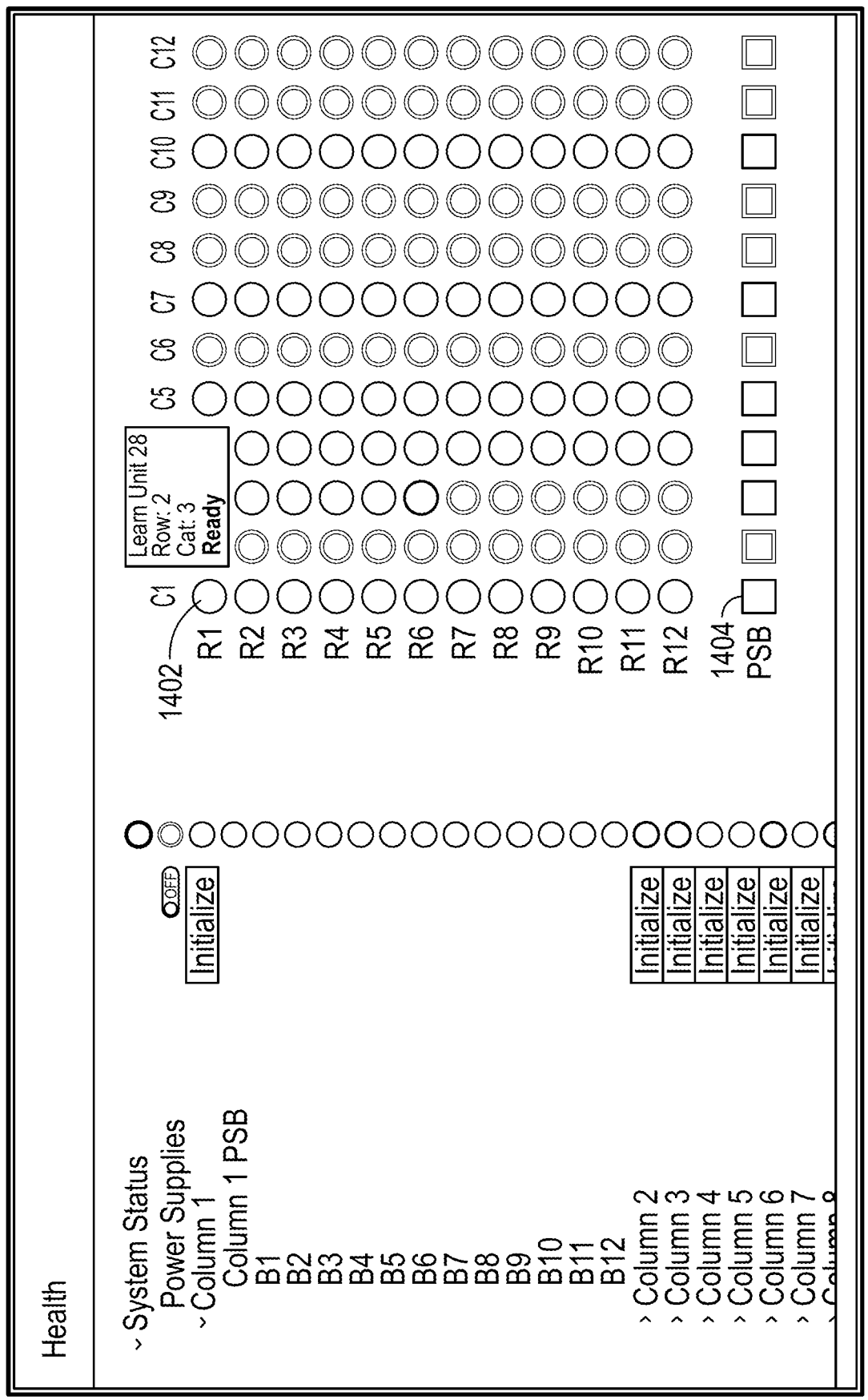
FIG. 14 illustrates a display showing the health of a system comprising a plurality of amplifiers.

The power management system 809_1 can include instructions executed by electronic processing system 811 to render to display device the state of the various amplifiers being controlled by the power management system 809_1. FIG. 14 illustrates the display of a display device showing the health of a system comprising, for instance, 144 amplifiers arranged in twelve columns and twelve rows. Each amplifier is represented by a circle 1402. A printed circuit board or power supply board is associated with each column, as represented by a square 1404. Indicia is provided to characterize the operational state of each element. For example, a down arrow or color red may represent a failed state. Side arrows or amber color may represent a state transition. An up arrow or color green may represent a healthy state. Absent indicia may represent an off state.

Various embodiments described herein maintain amplifier health in a number of ways. For example, as discussed above, the power management system 809_1 may enforce a limit on the bias voltage, drain current, duration of time the amplifier is turned on. Additionally, the measured characteristics (e.g., drain current/voltage, gate current/voltage, etc.) of the amplifier received by the power management system 809_1 can be analyzed to identify changes/degradation in the performance of the amplifier. Pre-emptive maintenance/repairs can be performed on the amplifier and the driving circuitry on the basis of the identified changes/degradation in the performance.

Dynamic Gate Biasing of RF Amplifier

Various applications comprising RF amplifiers may require optimizing/maximizing multiple figures of merit. The multiple figures of merit can include reliability, power efficiency, output power, linearity, bandwidth, signal-to-noise ratio, and temperature. Depending on the application, one or more of these figures of merit can be maximized or a pareto optimization of these figures of merit can be achieved. Pareto optimization refers to a situation in which no individual figure of merit can be improved without degrading at least one other figure of merit. The bias voltage provided to the amplifier can affect linearity, power efficiency and output power of the amplifier. The input signal power can affect the spurious-free dynamic range (SFDR) and linearity of the amplifier. Accordingly, various implementations of the power management system 809_1 described above can be configured to adjust the biasing power of the amplifier to optimize multiple figures of merit based on a user specification or a desired application. In various implementations, the power management system 809_1 can be configured to provide feedback to the RF signal generator 103 and/or the computer 102 that can be used to change/alter the characteristics of the input signal (e.g., input power, carrier frequency, waveform type, modulation, pulse width, duty cycle, etc.) to maximize/pareto optimize one or more figures of merit.

In various implementations, the power management system 809_1 in cooperation with the computer 102 and/or the RF signal generator 103 can be configured to adjust the bias voltages/currents provided to the amplifiers in the amplifier chain 104_1 and/or the power of the RF signal input to the amplifier to optimize linearity, output power and/or signal-to-noise ration of the RF signal output from the amplifiers in the amplifier chain 104_1. The optimization methods and systems can be implemented for RF signals over a broad range of frequencies and waveform characteristics as well as over a wide range of temperature of the amplifier. Additionally, the power management system 809_1 in cooperation with the computer 102 and/or the RF signal generator 103 can be configured to adjust the bias voltages/currents provided to the amplifiers in the amplifier chain 104_1 and/or the power of the RF signal input to the amplifier to reduce damage and/or to prevent failure of one or more amplifiers in the amplifier chain 104_1. Further, the power management system 809_1 in cooperation with the computer 102 and/or the RF signal generator 103 can be configured to adjust the gain bias voltage provided to the gate terminal of the amplifier in the amplifier chain 104_1 to optimize power efficiency and/or power of the RF signal output from the amplifiers in the amplifier chain 104_1 for different temperatures. Machine learning (ML) techniques/algorithms can be used to determine the bias voltages/currents, and/or the power levels and waveform characteristics of the input signal that would optimize output power and/or power efficiency over a range of frequencies and/or temperatures.

As discussed in further detail below, the power management system 809_1 in cooperation with the computer 102 and/or the RF signal generator 103 can be configured to dynamically adjust the bias voltages/currents and/or characteristics of the input RF signal (e.g., frequency, pulse width, duty cycle, power level, etc.) to maximize/optimize linearity of the amplifier. The power management system 809_1 in cooperation with the computer 102 and/or the RF signal generator 103 can be configured to dynamically adjust the bias voltages/currents and/or characteristics of the input RF signal (e.g., frequency, pulse width, duty cycle, power level, etc.) to maximize/optimize power efficiency of the amplifier. Machine learning (ML) techniques/algorithms can be used to determine the bias voltages/currents and/or characteristics of the input RF signal that would optimize linearity and/or power efficiency.

Figure 15:
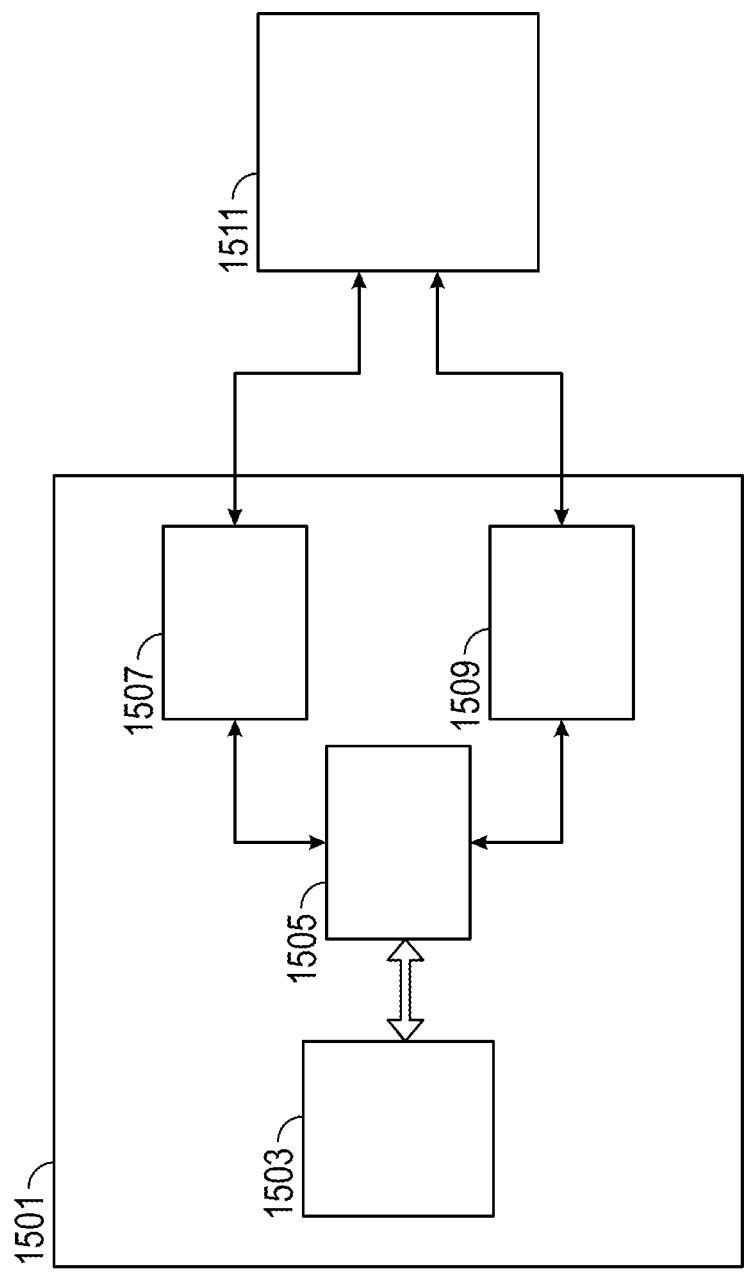
FIG. 15 schematically illustrates another implementation of a power management system that is configured to dynamically adjust bias power provided to an amplifier.

FIG. 15 schematically illustrates an implementation of a power management system 1501 that is configured to dynamically adjust the bias power provided to an implementation of an amplifier 1511. The amplifier 1511 can be a FET amplifier (e.g., a HEMT transistor). The power management system 1501 can be similar to the power management system 809_1 discussed above. Accordingly, the power management system 1501 can share all or many of the architectural/functional/operational characteristics of the power management system 809_1 discussed above. The power management system 1501 comprises a control system 1503, an electronic processing system 1505 configured to execute machine learning algorithms, a drain bias voltage/current sensor and modulator module 1507, and a gate bias voltage/current sensor and modulator module 1509. In various implementations, the drain bias voltage/current sensor and modulator module 1507 and the gate bias voltage/current sensor and modulator module 1509 can be combined in a single module. In some implementations, the drain bias voltage/current sensor can be separate from the drain bias current/voltage modulator. Similarly, the gate bias voltage/current sensor can be separate from the gate bias current/voltage modulator in some implementations. The power management system 1501 can comprise other sensors (e.g., temperature sensor) as discussed above with reference to FIGS. 8A-8C. In various implementations, the power management system 1501 can be configured to interface with a power distributing unit that is configured to convert power from a power source (e.g., AC power line, battery, generator, etc.) to voltages/currents required to bias the amplifier 1511. In various implementations, the power management system 1501 can be configured to control the power distributing unit, as discussed above. The power distributing unit can be similar to the power adapting system 823 and/or the power distributor 108. In various implementations, the power management system 1501 can be configured to communicate with components in the input signal path (e.g., RF signal generator 103, amplifiers or other electrical components) to the amplifier 1511 through a master controller (e.g., computer 102) and provide information that can be used to control characteristics of the input signal (e.g., frequency, waveform characteristics, input power level, pulse width, duty cycle, etc.). In various implementations, the power management system 1501 can be configured to directly communicate with and/or control components in the input signal path to vary characteristics of the input signal (e.g., frequency, waveform characteristics, input power level, pulse width, duty cycle, etc.).

The drain bias voltage/current sensor and modulator module 1507 is configured to (i) sense the drain current and voltage; and (ii) adjust the drain bias voltage and/or current of the amplifier 1511. The gate bias voltage/current sensor and modulator module 1509 is configured to (i) sense the gate current and voltage; and (ii) adjust the gate bias voltage and/or current of the amplifier. Adjusting the gate bias voltage/current and/or the drain bias voltage/current can change output power, gain provided by the amplifier, efficiency, thermal performance and/or linearity of the amplifier 1511. Without subscribing to any particular theory, linearity of the amplifier can be characterized by an amount of $3^{rd}$ order intermodulation distortion (IMD3) and/or $5^{th}$ order intermodulation distortion (IMD5). As discussed above, the drain current can be used to determine the temperature of the amplifier 1511 and/or the health of the amplifier 1511. Accordingly, the power management system 1501 can be used to check the health of the amplifier 1511 and preventive maintenance can be performed on the amplifier by changing the gate bias voltage and/or drain bias voltage in case there's a degradation in the health of the amplifier. In some implementations, the power management system 1501 can be configured to provide warnings regarding the health of the amplifier which can be used to replace systems/devices with failing amplifiers.

Various implementations of the power management system 1501 can be configured to store the values of the sensed current and voltage at the gate and drain terminals and temperature in corresponding registers from where they can be read through digital interface. In various implementations, the current, voltage and temperature values stored in the registers can be obtained by averaging over multiple current, voltage and temperature values.

As discussed above, the power management system 1501 can be configured to dynamically adjust (or modulate) the bias voltage/current provided to the gate and the drain terminals of the amplifier 1511 based on sensed voltages/currents at various terminals of the amplifier and/or characteristics of the input signal or output signal to maximize/pareto optimize one or more figures of merit including but not limited to linearity, power efficiency, and output power.

Figure 16:
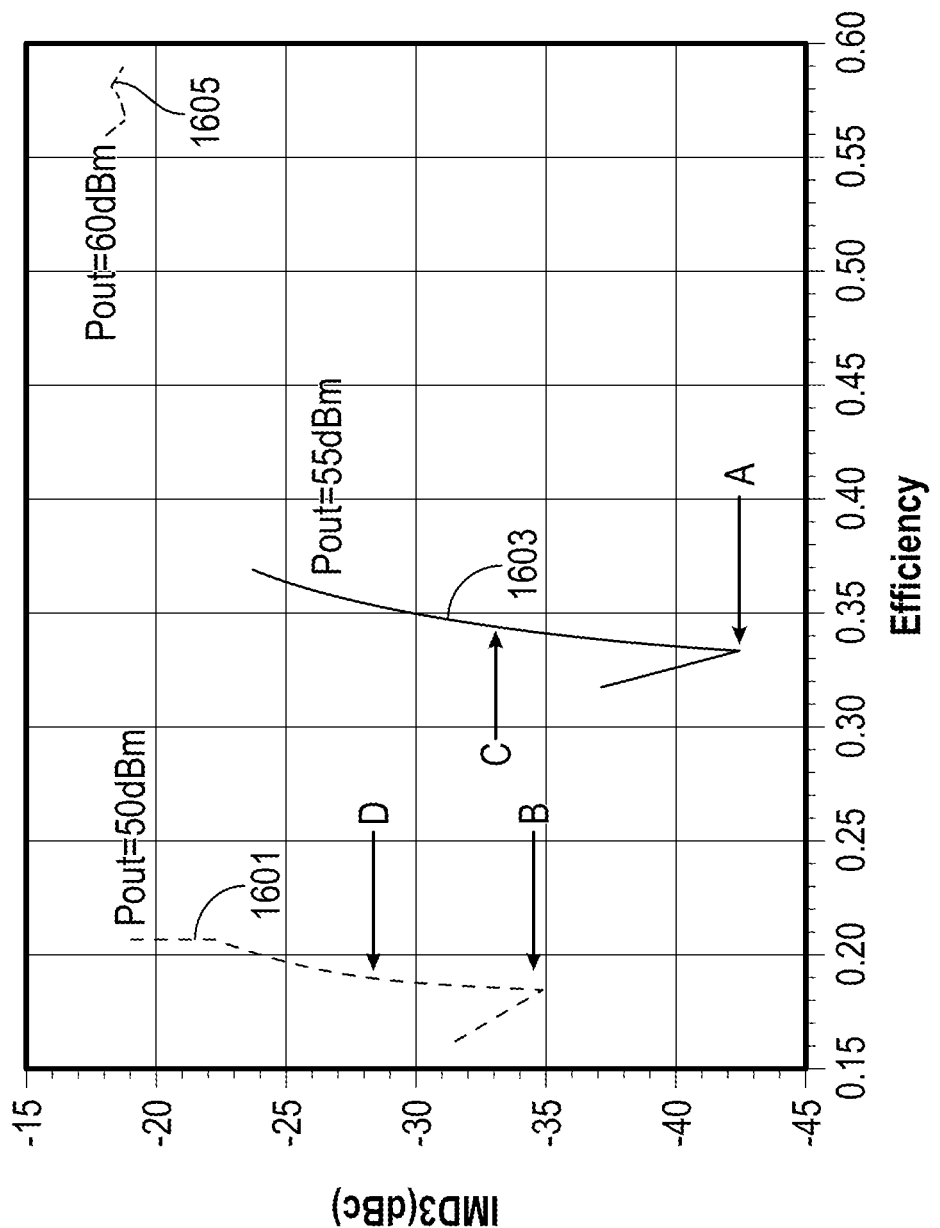
FIG. 16 shows the variation of the amount of third order intermodulation distortion as a function of drain efficiency for different levels of input and output power.

Without relying on any particular theory, the output power of the amplifier 1511 will reach a maximum value at a certain value of gate bias voltage, drain bias voltage and input power level. Any further increase in the input power level, the gate bias voltage or the drain bias voltage/current will not increase the output power beyond the maximum value. This operating state is referred to as saturation. The efficiency of the amplifier 1511 is also maximum when the amplifier 1511 is operated close to saturation. However, the linearity of the amplifier may decrease when the amplifier is operated close to saturation. This is depicted in FIG. 16 which shows the variation in the amount of two-tone $3^{rd}$ order intermodulation distortion (IMD3) as a function of drain efficiency for an implementation of the amplifier 1511. Without any loss of generality, the increase in efficiency is obtained by increasing the bias voltage at the gate terminal and/or the bias voltage at the drain terminal of the amplifier 1511.

In FIG. 16, curve 1601 shows the variation in the amount of two-tone $3^{rd}$ order intermodulation distortion (IMD3) as a function of drain efficiency for a first input power level and a first bias voltage level provided to the gate terminal which results in an output power of 50 dBm. In FIG. 16, curve 1603 shows the variation in the amount of two-tone $3^{rd}$ order intermodulation distortion (IMD3) as a function of drain efficiency for a second input power level and a second bias voltage level provided to the gate terminal which results in an output power of 55 dBm. In FIG. 16, curve 1605 shows the variation in the amount of two-tone $3^{rd}$ order intermodulation distortion (IMD3) as a function of drain efficiency for a third input power level and a third bias voltage level provided to the gate terminal which results in an output power of 60 dBm. The second bias voltage level is greater than the first bias voltage level and the third bias voltage level is greater than the second bias voltage level. At the third bias voltage level, the implementation of the amplifier 1511 is operated close to saturation. It is noted from FIG. 16 that when operated close to saturation, the efficiency of the implementation of the amplifier 1511 is greater than the efficiency when operated at the first or second bias voltage level. However, at the third bias voltage level the amount of two-tone $3^{rd}$ order intermodulation distortion (IMD3) is also greater than the amount of two-tone $3^{rd}$ order intermodulation distortion (IMD3) when operated in the first or second bias voltage level. A higher amount of two-tone $3^{rd}$ order intermodulation distortion (IMD3) corresponds to an increase in non-linearity. Accordingly, by adjusting the bias voltage level at the gate terminal and/or the power level of the input signal, the linearity of the amplifier can be improved. Without any loss of generality, adjusting the bias voltage provided to the drain terminal and/or the power level of the input signal can also affect linearity of the amplifier.

It is further noted from FIG. 16, that for a given output power lower than the saturated output power, a small sacrifice in the efficiency can provide a marked reduction in the amount of two-tone $3^{rd}$ order intermodulation distortion (IMD3). For example, with reference to curve 1603, the amount of two-tone $3^{rd}$ order intermodulation distortion (IMD3) decreases from about −30 dBc at an efficiency of about 0.35 to −42 dBc at an efficiency of about 0.34. Thus, efficiency and linearity can be optimized by adjusting the bias voltage/current levels at the gate and/or drain terminals of the amplifier. In the illustrated implementation the input power level and the bias voltage/current levels can be adjusted to operate the amplifier 1511 near the dip in the curve 1603 designated by point A to pareto optimize efficiency and linearity.

Based on a specification from a user or requirements of an application, the power management system 1501 can be configured to modulate the bias voltage/current levels at the gate and/or drain terminals to change the amount of power output from the amplifier 1511, the degree of linearity (as indicated by the amount of IMD3) and the efficiency of the amplifier 1511. This is further explained with reference to FIG. 16. The power management system 1501 can be configured to set the bias voltage/current level at the gate and/or drain terminals to a first setting such that the output power of the amplifier 1511 is below the maximum output power. For example, the amplifier 1511 can be configured to operate at/near point A of curve 1603 or at/near point B of curve 1601 when biased at the first setting. In this setting, the amount of IMD3 is close to a minimum resulting in an increase in the linearity of the amplifier 1511. The power management system 1501 can change the bias voltage/current level at the gate and/or drain terminals to a second setting such that the output power of the amplifier 1511, the efficiency and/or the degree of linearity is changed. For example, the amplifier 1511 can be configured to operate at/near point C of curve 1603 or at/near point D of curve 1601. Although the amplifier 1511 is configured to operate in the linear regime when biased at the second setting, the amount of IMD3 is not reduced to the lowest possible value for that output power. The power management system 1501 can be further configured to change the bias voltage/current level at the gate and/or drain terminals to a third setting such that the amplifier is configured to output the maximum possible output power. In this setting, the amplifier is operated at or near saturation, such as for example along the curve 1605. In this setting, the amplifier is configured to operate in the non-linear regime.

The power management system 1501 can be configured to change the bias current/voltage levels at the gate and/or drain terminals instantaneously or sufficiently instantaneously. For example, the time taken to switch the bias current/voltage levels from the first setting to the second or third setting can be in the range from a few nanoseconds to a few milliseconds. The power management system 1501 can be configured to change the Dbias current/voltage levels to change the operating state of the amplifier 1511 to points along the curve 1601/1603 or to points between curves 1601, 1603 and 1605.

Figure 17:
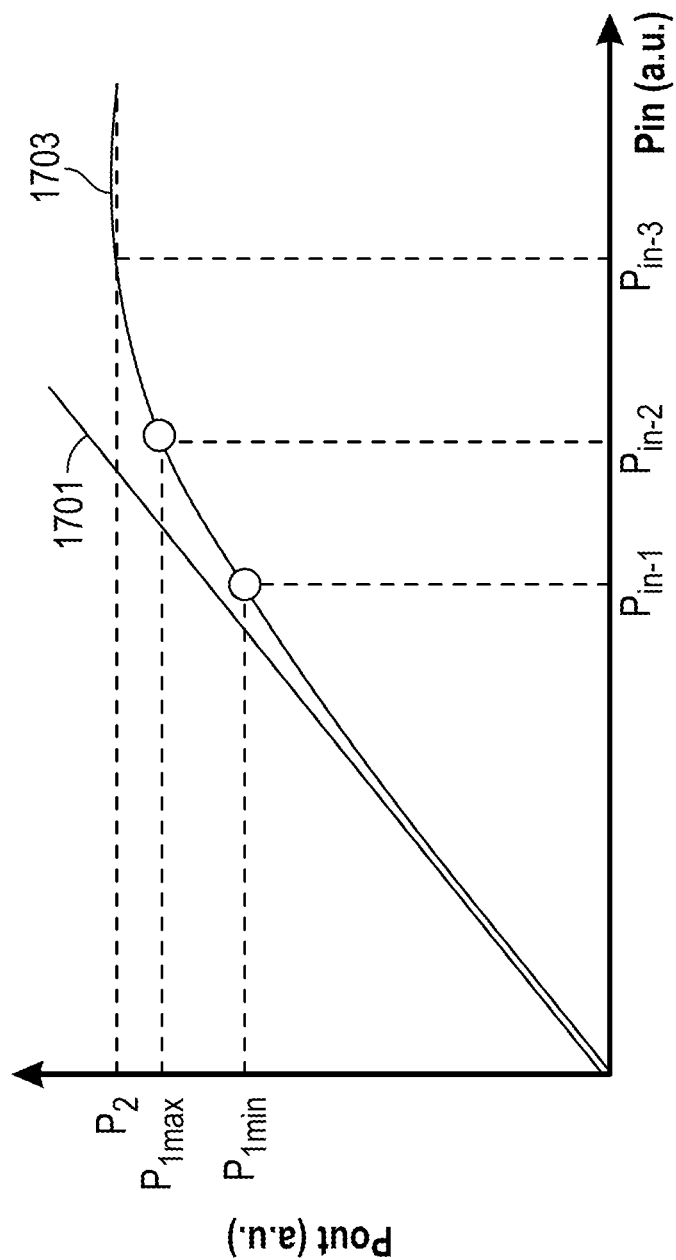
FIG. 17 shows the variation of output power versus input power for an implementation of an amplifier.

Referring to FIG. 17, curve 1703 is a power transfer curve that illustrates the variation of the output power of the amplifier 1511 with variation of the input power of the amplifier. As noted from FIG. 17, the variation of output power to the variation of input power is along the line 1701 or close to the line 1701 when the input power level is less than $P_{in-1}$ indicating a linear relationship between the output power and the input power. The amplifier is considered to operate in a linear regime when the input power is below $P_{in-1}$. The output power starts to deviate from the line 1701 for input power greater than $P_{in-1}$ indicating a non-linear relationship between the output power and the input power. The output power saturates at a level $P_2$ when the input power is greater than $P_{in-3}$. Any increase in power beyond $P_{in-3}$ will not cause any further increase in the output power. The amplifier is considered to operate in the saturated regime for input power greater than $P_{in-3}$. The amplifier is considered to operate in the non-linear regime for input power between $P_{in-1}$ and $P_{in-3}$. In addition to changing the bias voltage/current level at the gate and/or drain terminal of the amplifier, the power management system 1501 can provide feedback/instructions to change the power of the RF signal input to the amplifier to change the operating state of the amplifier smoothly along the curve 1703 from linear regime to non-linear regime to saturation regime. For instance, changing the operating state of the amplifier smoothly can involve making continuous transitions along the curve 1703. This feature of the power management system 1501 can be advantageous as discussed below with reference to FIG. 18.

Consider a RF system (e.g., an electromagnetic pulsed radiation system) comprising an amplifier 1511 controlled by the power management system 1501. It maybe desirable to operate the RF system in three different operating modes—a first radar mode, a second EMP mode, and a third communication mode. In the first mode, it may be advantageous to operate the amplifier 1511 in the non-linear regime. In the second mode, it may be advantageous to operate the amplifier 1511 in the saturation regime such that the output power is maximized. In the third mode, it may be advantageous to operate the amplifier 1511 in the linear regime. For such a system, the power management system 1501 can provide instructions/feedback to control the input power level to change the operating state of the amplifier 1511 between first, second and third mode. Additionally, the power management system 1501 can vary the bias voltage/current levels at the gate and drain terminals of the amplifier 1511 to improve linearity of the amplifier 1511, the efficiency of the amplifier 1511 and/or other figures of metric discussed above.

Figure 18:
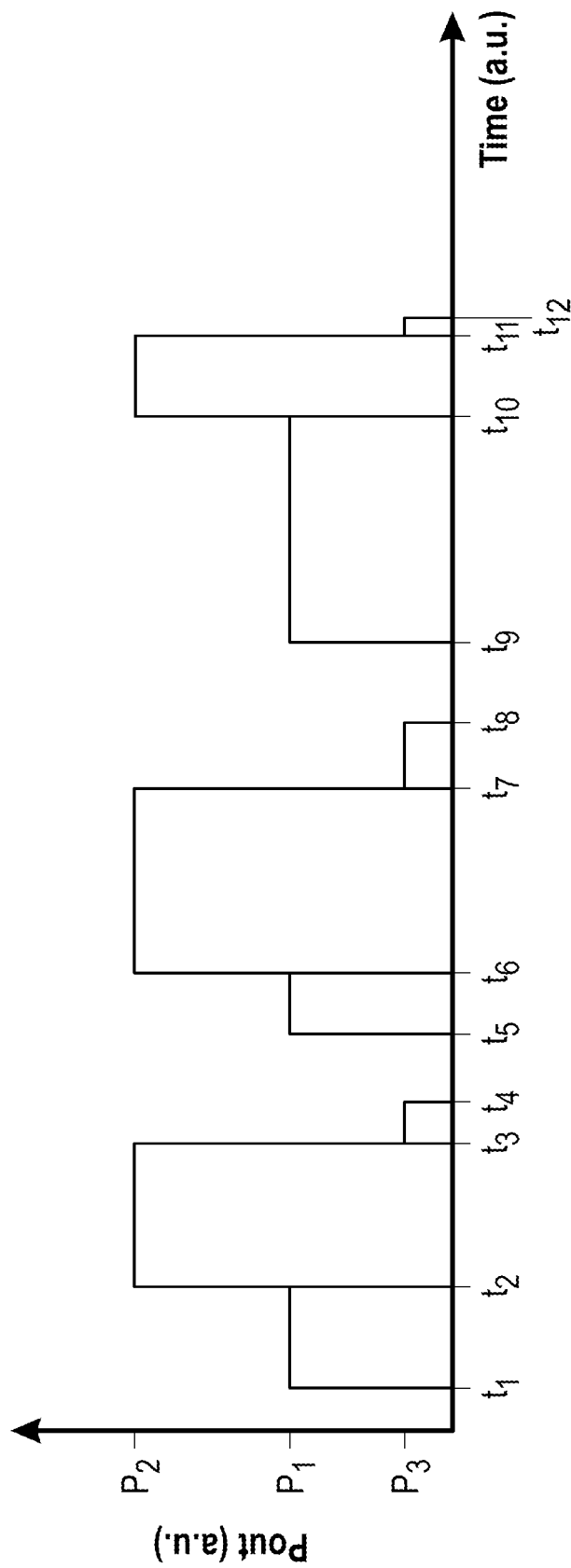
FIG. 18 shows the ability of the power management system that is configured to dynamically adjust bias power provided to an amplifier to switch the operating modes of the amplifier between three different operating modes.

FIG. 18 shows the variation of the power output from the amplifier 1511 with time for the three different operating modes. In FIG. 18, the amplifier 1511 is configured to operate in the first mode between times $t_1$ and $t_2$, $t_5$ and $t_6$ and $t_9$ and $t_{10}$. In this mode, the output power from the amplifier 1511 is set to $P_1$. The output power $P_1$ can have a value between $P_{1max}$ and $P_{1min}$ shown in FIG. 17. The corresponding input power can have a value between $P_{in-1}$ and $P_{in-2}$ shown in FIG. 17. The amplifier 1511 is configured to operate in the second mode between times $t_2$ and $t_3$, $t_6$ and $t_7$ and $t_{10}$ and $t_{11}$. In this mode, the output power from the amplifier 1511 is set to $P_2$ which is greater than $P_1$. The corresponding input power can have a value greater than or equal to $P_{in-1}$. The amplifier 1511 is configured to operate in the third mode between times $t_3$ and $t_4$, $t_7$ and $t_8$ and $t_{11}$ and $t_{12}$. In this mode, the output power from the amplifier 1511 is set to $P_3$ which is lesser than $P_1$. The output power $P_3$ can have a value less than $P_{1min}$ shown in FIG. 17. The corresponding input power can have a value less than $P_{in-1}$. As discussed above, the bias voltage/current levels can be adjusted to optimize various figures of merit for each of the first, second and third operating modes. As shown in FIG. 18, the time duration in each of the three operating modes as well as the duration of inactive time can be variable. The bias settings and/or input power level can be changed instantaneously or sufficiently instantaneously (e.g., in a range from about 1 nanosecond to about 1 millisecond) between the different operating modes.

The amplifier 1511 can be calibrated to determine the input power level and the bias voltage/current levels corresponding to the first, second and third operating modes. The determined bias voltage/current levels can be stored in a memory accessible to the power management system 1501. The power management system 1501 can be configured to change the operating mode of the amplifier 1511 based on an input received from a user or a controller. In various implementations, the power management system 1501 can be configured to turn off the amplifier 1511 during periods of inactivity between times $t_4$ and $t_5$, and $t_8$ and $t_9$, as discussed above to improve thermal management. In addition to changing the bias current/voltage levels to change the operating mode of the amplifier 1511, the power management system 1501 can be configured to modulate the bias voltage to the gate terminal in response to one or more sensed characteristic of the amplifier, such as, for example drain current to improve efficiency or thermal performance of the amplifier 1511.

Further to helping in improving thermal performance of the amplifier, adjusting the gain bias voltage can also change the class of the amplifier 1511. For example, changing the gate bias voltage can change the conduction angle which denotes the class of the amplifier. As the gate bias voltage increases, the conduction angle decreases from 360 degrees to 0 degrees corresponding to a change in amplifier class. The different classes of amplifier can include but not be limited to class A, class B, class AB, class C, class D, class E, class F, class G, class H, class S and class T. Accordingly, the power management system 1501 can be configured to change the amplifier class from one of class A, class AB, class B, class C, class D, class E, class F, class G, class H, class S and class T to another one of class A, class AB, class B, class C, class D, class E, class F, class G, class H, class S and class T. Adjusting the bias voltage/current level to the drain can optimize the efficiency of the amplifier 1511 for a particular class of amplifier.

Other Variations

Features, materials, characteristics, or groups described in conjunction with a particular aspect, embodiment, or example are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. Those skilled in the art will appreciate that in some embodiments, the actual steps taken in the processes disclosed and/or illustrated may differ from those shown in the figures. Depending on the embodiment, certain of the steps described above may be removed, others may be added. For example, the actual steps and/or order of steps taken in the disclosed processes may differ from those described and/or shown in the figure. Depending on the embodiment, certain of the steps described above may be removed, others may be added. For instance, the various components illustrated in the figures and/or described may be implemented as software and/or firmware on a processor, controller, ASIC, FPGA, and/or dedicated hardware. Furthermore, the features and attributes of the specific embodiments disclosed above may be combined in different ways to form additional embodiments, all of which fall within the scope of the present disclosure.

In some cases, there is provided a non-transitory computer readable medium storing instructions, which when executed by at least one computing or processing device, cause performing any of the methods as generally shown or described herein and equivalents thereof.

Any of the memory components described herein can include volatile memory, such random access memory (RAM), dynamic random access memory (DRAM), synchronous dynamic random access memory (SDRAM), double data rate (DDR) memory, static random access memory (SRAM), other volatile memory, or any combination thereof. Any of the memory components described herein can include non-volatile memory, such as magnetic storage, flash integrated circuits, read only memory (ROM), Chalcogenide random access memory (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof.

Any user interface screens illustrated and described herein can include additional and/or alternative components. These components can include menus, lists, buttons, text boxes, labels, radio buttons, scroll bars, sliders, checkboxes, combo boxes, status bars, dialog boxes, windows, and the like. User interface screens can include additional and/or alternative information. Components can be arranged, grouped, displayed in any suitable order.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without other input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, or within less than 0.01% of the stated amount.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations.

The foregoing description, for purposes of explanation, used specific nomenclature to provide a thorough understanding of the disclosure. However, it will be apparent to one skilled in the art that specific details are not required in order to practice the disclosed embodiments. Thus, the foregoing descriptions of specific embodiments are presented for purposes of illustration and description. They are not intended to be exhaustive or to limit the disclosure to the precise forms disclosed; obviously, many modifications and variations are possible in view of the above teachings. The embodiments were chosen and described in order to best explain the principles of the disclosure and its practical applications, they thereby enable others skilled in the art to best utilize the disclosure and various embodiments with various modifications as are suited to the particular use contemplated. It is intended that the claims as presented herein or as presented in the future and their equivalents define the scope of the protection.

What is claimed is:

1. An amplifying system comprising:
a radio-frequency (RF) amplifier comprising an input port and an output port, the RF amplifier configured to receive an incoming RF signal through the input port and output an outgoing RF signal through the output port, wherein the RF amplifier comprises a field effect transistor (FET) with a gate terminal, a drain terminal, and a source terminal; and
a power management system configured to, in response to an input received by the amplifying system, switch an operating class of the RF amplifier from a first operating class to a second operating class by adjusting an amount of bias power provided to the RF amplifier to operate the RF amplifier in the second operating class, wherein adjusting the amount of bias power provided to the RF amplifier comprises adjusting a bias voltage at the drain terminal of the FET during a first duration of time when the incoming RF signal is received through the input port and a second duration of time when the incoming RF signal is not received through the input port, the adjusting performed based on receiving a feedback from the RF amplifier that comprises a current at the drain terminal measured during the first duration of time and the second duration of time.

2. The amplifying system of claim 1, wherein the amplifying system is configured to receive the input from a user or a controller external to the amplifying system.

3. The amplifying system of claim 1, wherein the power management system is configured to switch the operating class of the RF amplifier in real-time.

4. The amplifying system of claim 1, wherein the first or second operating class is selected from the group consisting of class A, class B, class AB, class C, class D, class E, Class F, class G, class H, class S, and Class T.

5. The amplifying system of claim 1, wherein adjusting the amount of bias power provided to the RF amplifier optimizes at least two figures of merit of the RF amplifier selected from the group consisting of linearity of the RF amplifier, efficiency of the RF amplifier, gain of the RF amplifier, and output power of the RF amplifier.

6. The amplifying system of claim 1, wherein a power of the outgoing RF signal is different between the first operating class and the second operating class.

7. The amplifying system of claim 1, wherein adjusting the amount of bias power provided to the RF amplifier comprises adjusting a bias voltage at the gate terminal of the FET and the bias voltage at the drain terminal of the FET.

8. A radio-frequency (RF) device comprising:
an RF amplifier comprising a field effect transistor (FET) with a gate terminal, a drain terminal, and a source terminal; and
a power management system configured to, in response to an input received by the RF device, operate the RF amplifier in a first mode for a first duration of time and in a second mode for a second duration of time, wherein the power management system is configured to provide a first amount of bias power to the RF amplifier in the first mode and a second amount of bias power to the RF amplifier in the second mode, and
wherein providing at least one of the first or second amount of bias power comprises adjusting a bias voltage at the drain terminal of the FET during a first duration of time when the input is received by the RF amplifier and a second duration of time when the input is not received by the RF amplifier, the adjusting performed based on receiving a feedback from the RF amplifier that comprises a current at the drain terminal measured during the first duration of time and the second duration of time.

9. The RF device of claim 8, wherein the power management system is configured to provide the first amount of bias power by providing a first voltage at the drain terminal of the FET and provide the second amount of bias power by providing a second voltage at the drain terminal of the FET.

10. The RF device of claim 8, wherein the power management system is configured to, in response to the input received by the RF device, operate the RF amplifier in a third mode for a third duration of time, wherein the power management system is configured to provide a third amount of bias power to the RF amplifier in the third mode.

11. The RF device of claim 10, wherein the third mode is selected from a group consisting of a radar mode, a high-power microwave mode, a directed energy mode and a communications mode.

12. The RF device of claim 10, wherein the power management system is configured to provide the third amount of bias power by providing a third amount of voltage at the drain terminal, the third amount of voltage different from a first amount of voltage provided at the drain terminal in the first mode and second amount of voltage provided at the drain terminal in the second mode.

13. The RF device of claim 8, wherein the first mode or the second mode is selected from a group consisting of a radar mode, a high-power microwave mode, a directed energy mode and a communications mode.

14. The RF device of claim 8, wherein an amount of power of a signal output by the RF amplifier is different between the first mode of operation and the second mode of operation.

15. The RF device of claim 8, wherein an amount of bias power provided by the power management system to the RF amplifier is determined based on a sensed parameter of the RF amplifier.

16. The RF device of claim 15, wherein the sensed parameter of the RF amplifier comprises a current, voltage or temperature.

17. A method of operating a radio-frequency (RF) device, the method comprising:
by a power management system of the RF device comprising a field effect transistor (FET) with a gate terminal, a drain terminal, and a source terminal:
in response to an input received by the RF device, operating an RF amplifier of the RF device in a first mode for a first duration of time and in a second mode for a second duration of time,
wherein operating the RF amplifier in the first mode comprises providing a first amount of bias power to the RF amplifier,
wherein operating the RF amplifier in the second mode comprises providing a second amount of bias power to the RF amplifier, and
wherein providing at least one of the first or second amount of bias power comprises adjusting a bias voltage at the drain terminal of the FET during a first duration of time when the input is received by the RF amplifier and a second duration of time when the input is not received by the RF amplifier, the adjusting performed based on receiving a feedback from the RF amplifier that comprises a current at the drain terminal measured during the first duration of time and the second duration of time.

18. The method of claim 17, wherein:
providing the first amount of bias power comprises providing a first voltage at the drain terminal of the FET; and
providing the second amount of bias power comprises providing a second voltage at the drain terminal of the FET.

19. The method of claim 17, further comprising, by the power management system:
in response to the input received by the RF device, operating the RF amplifier in a third mode for a third duration of time by providing a third amount of bias power to the RF amplifier.

20. The method of claim 19, wherein:
providing the third amount of bias power comprises providing a third amount of voltage at the drain terminal, the third amount of voltage different from a first amount of voltage provided at the drain terminal in the first mode and second amount of voltage provided at the drain terminal in the second mode.

* * * * *